United States Patent
D'Andrade et al.

(10) Patent No.: US 7,285,907 B2
(45) Date of Patent: *Oct. 23, 2007

(54) HIGH EFFICIENCY MULTI-COLOR ELECTRO-PHOSPHORESCENT OLEDS

(75) Inventors: Brian D'Andrade, Princeton, NJ (US); Mark E. Thompson, Anaheim, CA (US); Stephen R. Forrest, Princeton, NJ (US)

(73) Assignees: The University of Southern California, Los Angeles, CA (US); The Trustees of Princeton University, Princeton, NJ (US)

( * ) Notice: Subject to any disclaimer, the term of this patent is extended or adjusted under 35 U.S.C. 154(b) by 146 days.

This patent is subject to a terminal disclaimer.

(21) Appl. No.: 11/211,385

(22) Filed: Aug. 24, 2005

(65) Prior Publication Data

US 2005/0282036 A1  Dec. 22, 2005

Related U.S. Application Data

(63) Continuation of application No. 10/144,419, filed on May 13, 2002, now Pat. No. 7,009,338.

(60) Provisional application No. 60/291,496, filed on May 16, 2001.

(51) Int. Cl.
   *H01L 51/50* (2006.01)
   *H01L 51/54* (2006.01)
   *H05B 33/14* (2006.01)

(52) U.S. Cl. ............... 313/504; 313/503; 313/506; 428/690; 428/917

(58) Field of Classification Search ............ 313/503, 313/504, 506
See application file for complete search history.

(56) References Cited

U.S. PATENT DOCUMENTS 5,231,329 A  7/1993  Nishikitani et al.

(Continued)

FOREIGN PATENT DOCUMENTS

WO    WO 00/57676    9/2000

(Continued)

OTHER PUBLICATIONS

M. A. Baldo, et al., "Highly efficient phosphorescent emission from organic electroluminescent devices," Nature, Sep. 1998, vol. 395, pp. 151-154.

(Continued)

*Primary Examiner*—Mariceli Santiago
(74) *Attorney, Agent, or Firm*—Kenyon & Kenyon LLP

(57) ABSTRACT

The present invention relates to efficient organic light emitting devices (OLEDs) doped with multiple light-emitting dopants, at least one dopant comprising a phosphorescent emitter, in a thin film emissive layer or layers. The present invention is directed to an efficient phosphorescent organic light emitting device utilizing a plurality of emissive dopants in an emissive region, wherein at least one of the dopants is a phosphorescent material. Thus, the present invention provides an organic light emitting device comprising an emissive region, wherein the emissive region comprises a host material, and a plurality of emissive dopants, wherein the emissive region is comprised of a plurality of bands and each emissive dopant is doped into a separate band within the emissive region, and wherein at least one of the emissive dopants emits light by phosphorescence.

19 Claims, 17 Drawing Sheets

Device Structure

U.S. PATENT DOCUMENTS

| | | | |
|---|---|---|---|
| 5,540,999 | A | 7/1996 | Yamamoto et al. |
| 5,703,436 | A | 12/1997 | Forrest et al. |
| 5,707,745 | A | 1/1998 | Forrest et al. |
| 5,721,160 | A | 2/1998 | Forrest et al. |
| 5,756,224 | A | 5/1998 | Borner et al. |
| 5,757,026 | A | 5/1998 | Forrest et al. |
| 5,757,139 | A | 5/1998 | Forrest et al. |
| 5,811,833 | A | 9/1998 | Thompson |
| 5,834,893 | A | 11/1998 | Bulovic et al. |
| 5,837,391 | A | 11/1998 | Utsugi |
| 5,844,363 | A | 12/1998 | Gu et al. |
| 5,861,219 | A | 1/1999 | Thompson et al. |
| 5,874,803 | A | 2/1999 | Garbuzov et al. |
| 5,917,280 | A | 6/1999 | Burrows et al. |
| 5,922,396 | A | 7/1999 | Thompson |
| 5,932,895 | A | 8/1999 | Shen et al. |
| 5,953,587 | A | 9/1999 | Forrest et al. |
| 5,981,306 | A | 11/1999 | Burrows et al. |
| 5,986,268 | A | 11/1999 | Forrest et al. |
| 5,986,401 | A | 11/1999 | Thompson et al. |
| 5,998,803 | A | 12/1999 | Forrest et al. |
| 6,005,252 | A | 12/1999 | Forrest et al. |
| 6,013,538 | A | 1/2000 | Burrows et al. |
| 6,013,982 | A | 1/2000 | Thompson et al. |
| 6,097,147 | A | 8/2000 | Baldo et al. |
| 6,303,238 | B1 | 10/2001 | Thompson et al. |
| 6,420,031 | B1 | 7/2002 | Parthasarathy et al. |
| 6,469,437 | B1 | 10/2002 | Parthasarathy et al. |
| 6,580,213 | B2 | 6/2003 | Yamazaki |
| 7,009,338 | B2 * | 3/2006 | D'Andrade et al. ........ 313/504 |
| 2001/0053462 | A1 | 12/2001 | Mishima |
| 2002/0050786 | A1 | 5/2002 | Yamazaki et al. |
| 2002/0071963 | A1 | 6/2002 | Fujii |
| 2003/0170491 | A1 | 9/2003 | Liao et al. |

FOREIGN PATENT DOCUMENTS

| | | |
|---|---|---|
| WO | WO 02/274015 | 9/2002 |
| WO | WO 03/100880 | 12/2003 |

OTHER PUBLICATIONS

M.A. Baldo, et al., "Very high-efficiency green organic light-emitting devices based on electrophosphorescence", Applied Physics Letters, vol. 75, No. 1, pp. 4-6, Jul. 5, 1999.

C. Adachi, et al., "High-efficiency organic electrophosphorescent devices with tris(2-phenylpyridine) iridium doped into electron-transporting materials", App. Phys. Lett., vol. 77, No. 6, pp. 904-906, (Aug. 7, 2000).

C. Adachi, et al., "High-efficiency red electrophosphorescence devices", App. Phys. Lett., vol. 78, No. 11, pp. 1622-1624 (Mar. 12, 2001).

M.A. Baldo, et al., "Excitonic singlet-triplet ratio in a semiconducting organic thin film", Phys. Rev., B vol. 60, No. 20, pp. 14422-14428 (Nov. 15, 1999).

M.A. Baldo, et al., "Transient analysis of organic electrophosphorescence: I. Transient analysis of triplet energy transfer", Phys. Rev. B vol. 62, No. 16, pp. 10958-10966 (Oct. 15, 2000).

M.A. Baldo, et al., "Transient analysis of organic electrophosphorescence: I. Transient analysis of triplet-triplet annihilation" Phys. Rev. B vol. 62, No. 16, pp. 10967-10977 (Oct. 15, 2000).

D.F. O'Brien, et al., "Improved energy transfer in electrophosphorescent devices", Applied Physics Letters, vol. 74, No. 3, pp. 442-444, (Jan. 18, 1999).

T. Tsutsui et al., "High quantum efficiency in organic light-emitting devices with iridium-complex as a triplet emissive center", Japanese. J. Appl. Phys., Part 2, No. 12B, vol. 38, pp. L1502-1504 (Dec. 15, 1999).

M. J. Yang et al., "Use of Poly(9-vinylcarbazole) as host material for iridium complexes in high-efficiency organic light emitting devices", Japanese J. Appl. Phys., Part 2, No. 8A, vol. 39, pp. L828-L829 (Aug. 1, 2000).

C. L. Lee et al., "Polymer phosphorescent light-emitting devices doped with tris(2-phenylpyridine) iridium as a triplet emitter", Appl. Phys. Lett., vol. 77, No. 15, pp. 2280-2282 (Oct. 9, 2000).

C.W. Tang et al., "Electroluminescence of doped organic thin films", J. Appl. Phys., vol. 65, No. 9, pp. 3610-3616 (May 1, 1989).

P.I. Djurovich et al., "Ir(III) Cyclometalated Complexes As Efficient Phosphorescent Emitters In Polymer Blend And Organic LEDs", Polymer Preprints, vol. 41, No. 1, pp. 770-771 (Mar. 2000).

R.C. Kwong et al., "Efficient, Saturated Red Organic Light Emitting Devices Based on Phosphorescent Platinum (II) Porphyrins" Chem. Mater., vol. 11, No. 12, pp. 3709-3713 (Dec. 1999).

M. Baldo et al., "Organic Vapor Phase Deposition" Advanced Materials, vol. 10, No. 18, pp. 1505-1514, (Dec. 18, 1998).

F. Hide et al., "White light from InGaN/conjugated polymer hybrid light-emitting diodes" Appl. Phys. Lett., vol. 70, No. 20, pp. 2664-2666 (May 19, 1997).

J. Kido et al., "Single-layer white light-emitting organic electroluminescent devices based on dye-dispersed poly (N-vinylcarbazole)" Appl. Phys. Lett., vol. 67, No. 16, pp. 2281-2283 (Oct. 16, 1995).

R.S. Deshpande et al., "White-light-emitting organic electroluminescent devices based on interlayer sequential energy transfer" Appl. Phys. Lett., vol. 75, No. 7, pp. 888-890 (Aug. 16, 1999).

I. Sokolik et al., "Bimolecular reactions of singlet excitons in tris(8-hydroxyquinoline) aluminum" Appl. Phys. Lett., vol. 69, No. 27, pp. 4168-4170 (Dec. 30, 1996).

D. J. Milliron et al. "Surface oxidation activates indium tin oxide for hole injection" J. Appl. Phys., vol. 87, No. 1, pp. 572-576 (Jan. 1, 2000).

T. M. Brown et al., "Energy level line-up in polymer light-emitting diodes via electroabsorption spectroscopy", IEE Proceedings Optoelectronics vol. 148, No. 1, pp. 74-80 (Feb. 2001).

U.S. Appl. No. 09/978,455, filed Oct. 16, 2001, entitled "Organometallic compounds and emission-shifting organic electorphosphorescence".

U.S. Appl. No. 10/087,417, filed Mar. 1, 2002, entitled Double Doped-layer, Phosphorescent Organic Light Emitting Devices.

Y. Kunugi, et al., "A Vapochromic LED", J. Am. Chem. Soc., vol. 120, No. 3, pp. 589-590, 1998.

Baldo et al., "High Efficiency Fluorescent Organic Light Emitting Devices Using a Phosphorescent Sensitizer", Nature, 2000,4 03, 6771, pp. 750-753.

* cited by examiner

FIr(pic)

Ir(ppy)$_3$

Bt$_2$(acac)

Btp$_2$(acac)

HIGH EFFICIENCY MULTI-COLOR ELECTRO-PHOSPHORESCENT OLEDS

RELATED APPLICATIONS

This application is a continuation of U.S. patent application Ser. No. 10/144,419, filed May 13, 2002, now U.S. Pat. No. 7,009,338, which claims benefit of U.S. Provisional Patent Application No. 60/291,496, filed May 16, 2001. The contents of those applications are incorporated herein in their entirety by reference.

GOVERNMENT RIGHTS

This invention was made with Government support under Contract No. F33615-94-1-1414 awarded by DARPA. The government has certain rights in this invention.

RESEARCH AGREEMENTS

The claimed invention was made by, on behalf of, and/or in connection with one or more of the following parties to a joint university-corporation research agreement: Princeton University, The University of Southern California, and Universal Display Corporation. The agreement was in effect on and before the date the claimed invention was made, and the claimed invention was made as a result of activities undertaken within the scope of the agreement.

FIELD OF THE INVENTION

The present invention relates to efficient organic light emitting devices (OLEDs) doped with multiple light-emitting dopants, at least one dopant comprising a phosphorescent emitter, in a thin film emissive layer or layers. One object of the invention is to fabricate inexpensive, white-light-emitting organic light emitting devices. Another object of the invention is to tune the color of monochrome displays.

BACKGROUND OF THE INVENTION

Organic light emitting devices (OLEDs), which utilize thin film materials that emit light when excited by electric current, are expected to become an increasingly popular form of flat panel display technology. This is because OLEDs have a wide variety of potential applications, including cell phones, personal digital assistants (PDAs), computer displays, informational displays in vehicles, television monitors, as well as light sources for general illumination. Due to their bright colors, wide viewing angle, compatibility with full motion video, broad temperature ranges, thin and conformable form factor, low power requirements and the potential for low cost manufacturing processes, OLEDs are seen as a future replacement technology for cathode ray tubes (CRTs) and liquid crystal displays (LCDs), which currently dominate the growing $40 billion annual electronic display market. Due to their high luminous efficiencies, electrophosphorescent OLEDs are seen as having the potential to replace incandescent, and perhaps even fluorescent, lamps for certain types of applications.

Light emission from OLEDs is typically via fluorescence or phosphorescence. As used herein, the term "phosphorescence" refers to emission from a triplet excited state of an organic molecule and the term "fluorescence" refers to emission from a singlet excited state of an organic molecule.

Successful utilization of phosphorescence holds enormous promise for organic electroluminescent devices. For example, an advantage of phosphorescence is that all excitons (formed by the recombination of holes and electrons in an EL), which are formed either as a singlet or triplet excited state, may participate in luminescence. This is because the lowest singlet excited state of an organic molecule is typically at a slightly higher energy than the lowest triplet excited state. This means that, for typical phosphorescent organometallic compounds, the lowest singlet excited state may rapidly decay to the lowest triplet excited state from which the phosphorescence is produced. In contrast, only a small percentage (about 25%) of excitons in fluorescent devices are capable of producing the fluorescent luminescence that is obtained from a singlet excited state. The remaining excitons in a fluorescent device, which are produced in the lowest triplet excited state of an organic molecule, are typically not capable of being converted into the energetically unfavorable higher singlet excited states from which the fluorescence is produced. This energy, thus, becomes lost to decay processes that heat-up the device rather than emit visible light. As a consequence, since the discovery that phosphorescent materials can be used as the emissive material in highly efficient OLEDs, there is now much interest in finding still more efficient electrophosphorescent materials and OLED structures containing such materials.

White organic light-emitting devices (WOLEDs) are of interest because they offer low-cost alternatives for backlights in flat-panel displays, and may eventually find use in room or area lighting. There have been several methods for obtaining white light from organic materials. [R. S. Deshpande, V. Bulovic and S. R. Forrest, Appl. Phys. Lett. 75, 888 (1999); F. Hide, P. Kozodoy, S. P. DenBaars and A. J. Heeger, Appl. Phys. Lett. 70, 2664 (1997); and J. Kido, H. Shionoya and K. Nagai, Appl. Phys. Lett. 67, 2281 (1995)]. All of these rely on the use of a combination of several emitting materials because individual organic molecules do not span typically the entire visible spectrum from 380 nm to 780 nm. As defined by the Commission Internationale d'Eclairage (CIE), an ideal white light source has coordinates of (0.33, 0.33). Additionally, the Color Rendering Index (CRI) of a white light source is a measure of the color shift that an object undergoes when illuminated by the light source as compared with the color of the same object when illuminated by a reference source of comparable color temperature. The values of CRI range from 0 to 100, with 100 representing no shift in color. White light sources are referenced to daylight, with fluorescent bulbs typically having ratings between 60 and 90, mercury lamps near 50, and high pressure sodium lamps can have a CRI of 20. Typical luminous power efficiencies for white light sources are 15 lm/W for an incandescent light bulb and about 80 lm/W for a fluorescent lamp, not including system losses.

Over the last decade, the power ($\eta_p$) and external quantum ($\eta_{ext}$) efficiencies of white OLEDs have been steadily improving. Electrophosphorescent OLEDs have been shown to have very high $\eta_{ext}$ when used in single emissive layer devices. [C. Adachi, M. A. Baldo, M. E. Thompson, R. C. Kwong, M. E. Thompson and S. R. Forrest, Appl. Phys. Lett. 78, 1622 (2001); C. Adachi, M. A. Baldo, S. R. Forrest and M. E. Thompson, Appl. Phys. Lett. 77, 904 (2000); M. A. Baldo, S. Lamansky, P. E. Burrows, M. E. Thompson and S. R. Forrest, Appl. Phys. Lett. 75, 4 (1999); and M. A. Baldo, D. F. O'Brien, Y. You, A. Shoustikov, S. Sibley, M. E. Thompson and S. R. Forrest, 395, 151 (1998)].

High efficiency organic light emitting devices (OLEDs) using the phosphorescent dopant, fac tris(2-phenylpyridine) iridium (Ir(ppy)$_3$), have been demonstrated using several different conducting host materials. M. A. Baldo et al., Nature, vol. 395, 151 (1998); D. F. O'Brien et al., Appl. Phys. Lett., vol. 74, 442 (1999); M. A. Baldo et al., Appl. Phys. Lett., vol. 75, 4 (1999); T. Tsutsui et al., Japanese. J. Appl. Phys., Part 2, vol. 38, L1502 (1999); C. Adachi et al., Appl. Phys. Lett., vol. 77, 904 (2000); M. J. Yang et al., Japanese J. Appl. Phys., Part 2, vol. 39, L828 (2000); and C. L. Lee et al., Appl. Phys. Lett., vol. 77, 2280 (2000). Since the triplet level of the metal-ligand charge transfer state of the green-emitting Ir(ppy)$_3$ is between 2.5 eV and 3.0 eV, deep blue fluorophores with a peak wavelength at about 400 nm, such as 4,4'-N,N'-dicarbazole-biphenyl (CBP), are likely candidates as triplet energy transfer and exciton confining media. Using 6% to 10%-Ir(ppy)$_3$ in CBP leads to efficient Ir(ppy)$_3$ phosphorescence. In addition to the energetic resonance between the dopant and the host, the control of charge carrier injection and transport in the host layers is believed to be necessary for achieving efficient formation of radiative excitons. High electrophosphorescence efficiency has been achieved using Ir(ppy)$_3$ doped into CBP along with a 2,9-dimethyl-4,7-diphenyl-phenanthroline (BCP) electron transport and exciton blocking layer. M. A. Baldo et al., Appl. Phys. Lett., vol. 75, 4 (1999). In that device, the doped CBP layer was found to readily transport holes.

Electrophosphorescent OLEDs are typically comprised of several layers so as to achieve the desired combination of OLED performance characteristics. For example, high efficiencies in organic light emitting devices (OLEDs) may be obtained by differentiating the charge transport and luminescent functions between a host and guest material. A suitable host material may act as a good transporter of charge, as well as efficiently transferring energy to a highly luminescent guest. In fluorescent devices, light may be obtained from singlet excitons formed on the host and rapidly transferred to the guest by Forster energy transfer. Partly owing to this rapid energy transfer, singlet excitons do not diffuse significantly within the host before transferring to the guest material. Thus, OLEDs doped with fluorescent dyes may possess very thin emitting layers, typically approximately 5 nm thick. Tang et al., J. Appl. Phys., vol. 65 (1989) p. 3610.

To obtain electroluminescent emission from more than one emissive material in a fluorescent device, singlet energy transfer may either be retarded, so that some excitons remain on the host material until they relax and emit light; or a multiple-stage energy transfer process, involving several fluorescent dyes, may be employed. Retarded energy transfer is typically an inefficient process and relies on emission from the host. Multiple-stage energy transfer is also possible; however, it may require very precise control over doping concentrations within the about-5-nm-thick luminescent region. Deshpande et al., Appl. Phys. Lett. Vol. 75, No. 7, 888-890 (1999).

In spite of these difficulties in obtaining efficient electroluminescent emission from more than one emissive material, having a plurality of light-emitting dopants within the emissive region of a single organic light emitting device would be very desirable, because the color and intensity of each of the emissive dopants could be tailored to produce a desired output color of light emission, including white light emission. It would be desirable if such devices could be tuned to produce light of a desired color using highly efficient phosphorescent materials.

SUMMARY OF THE INVENTION

The present invention is directed to an efficient phosphorescent organic light emitting device utilizing a plurality of emissive dopants in an emissive region, wherein at least one of the dopants is a phosphorescent material. The host material of the emissive region may be comprised of a charge-carrying material that has a wide energy gap so as to inhibit energy transfer between phosphorescent dopants.

One object of the present invention is to provide a organic light emitting device comprising an emissive region, wherein the emissive region comprises a host material, and a plurality of emissive dopants, wherein the emissive region is comprised of a plurality of bands and each emissive dopant is doped into a separate band within the emissive region, and wherein at least one of the emissive dopants emits light by phosphorescence.

Another object of the present invention is to provide a multi-emissive layer electrophosphorescent OLED that can take advantage of the diffusion of triplet excitons to produce bright white devices with high power and quantum efficiencies. The device color can be tuned by varying the thickness and the dopant concentrations in each layer, or band, and by introducing exciton blocking layers between emissive layers.

Another object of the present invention is to produce white light emitting OLEDs that exhibit high external quantum efficiency ($\eta_{ext}$) and brightness compared to other white light emitting devices. For example, white-light-emitting organic light emitting devices can be fabricated that have CIE chromaticity coordinates of about (0.33, 0.33). The emission spectrum produced by the devices of the present invention can be tuned to sufficiently span the visible spectrum so as to appear substantially white, for example, a CIE x-coordinate of about 0.30 to about 0.40 in combination with a CIE y-coordinate of about 0.30 to about 0.45. Preferably the CIE x,y-coordinates are about (0.33, 0.33). Moreover, the devices of the present invention are preferably capable of producing white emission having a CIE (Commission Internationale de l'Eclairage) color rendering index (CRI) of at least about 70. More preferably, the CRI is higher than about 80. Alternatively, instead of seeking a very high CRI, the method might be used to produce a selected colored emission having prescribed CIE coordinates.

Another object of the invention is to make use of the very long diffusion lengths of triplet excitons that are responsible for phosphorescence to facilitate the emission from several stacked emission layers, as compared to singlet excitons that are responsible for fluorescence, which have a maximum diffusion length of less than about 10 nm or so. The long diffusion length of triplet excitons permits phosphorescent emission from a width as wide as several stacked 10 nm-thick layers and up to a combined thickness of more than 100 nm. [M. A. Baldo and S. R. Forrest, Phys. Rev. B 62, 10958 (2000); and I. Sokolik, R. Priestley, A. D. Walser, R. Dorsinville and C. W. Tang, Appl. Phys. Lett. 69, 4168 (1996)]

BRIEF DESCRIPTION OF THE FIGURES

For the purpose of illustrating the invention, representative embodiments are shown in the accompanying figures, it being understood that the invention is not intended to be limited to the precise arrangements and instrumentalities shown.

DETAILED DESCRIPTION OF THE PREFERRED EMBODIMENTS

Figure 1:
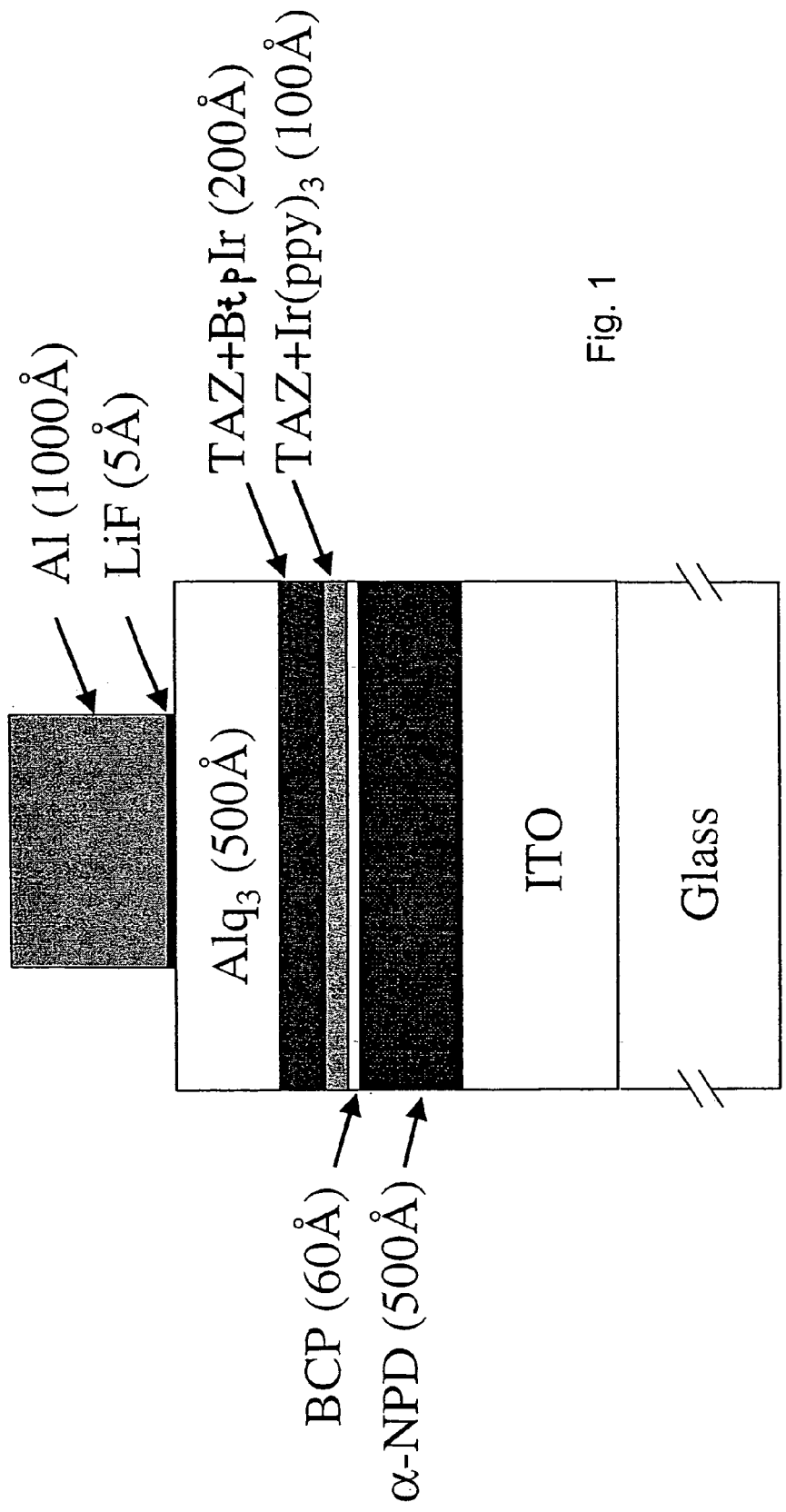
FIG. 1 shows a schematic representation of one embodiment of an OLED structure according to the present invention.
Figure 2:
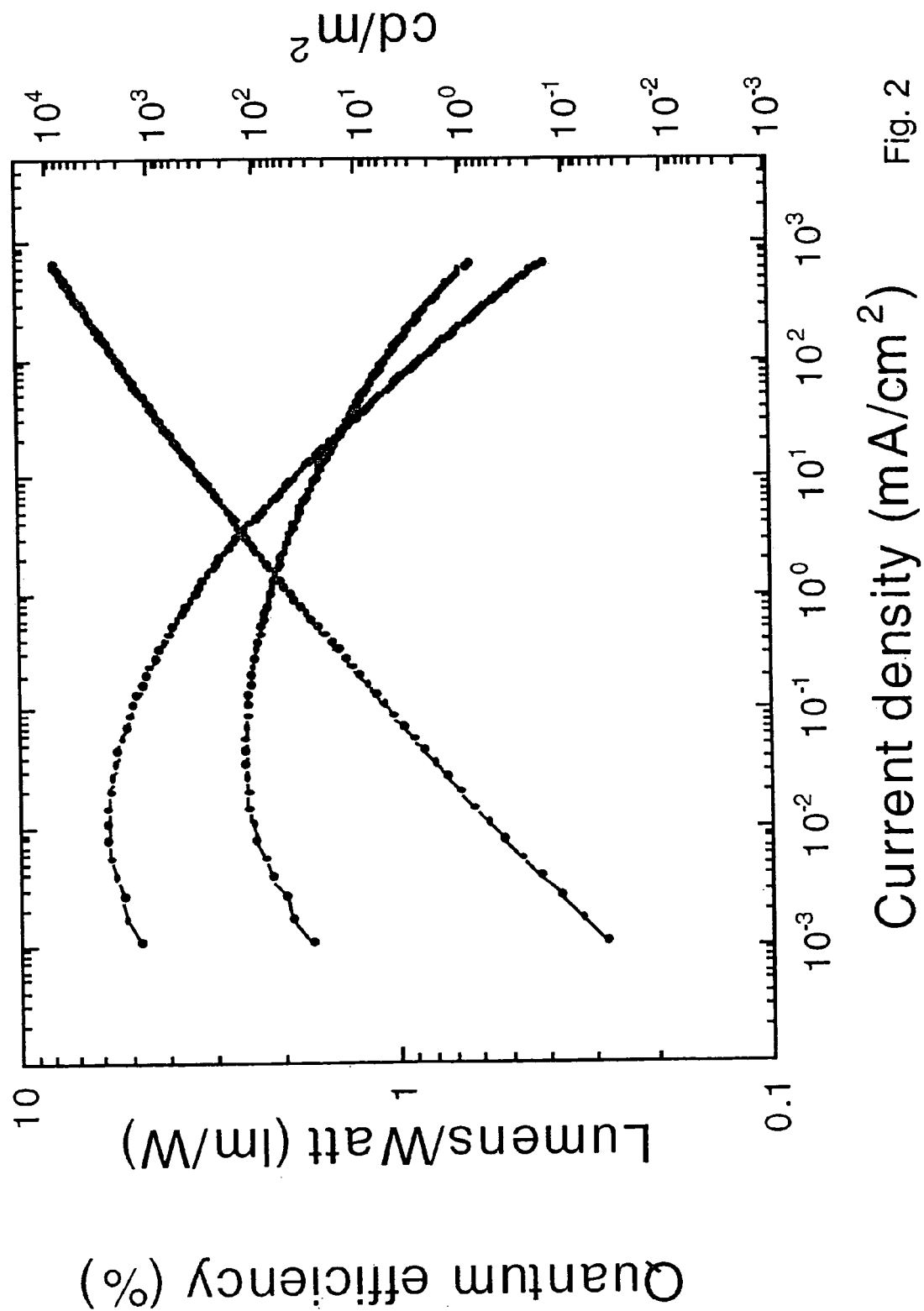
FIG. 2 shows the external quantum efficiency and luminance as a function of the current density for one embodiment of the present invention.
Figure 3:
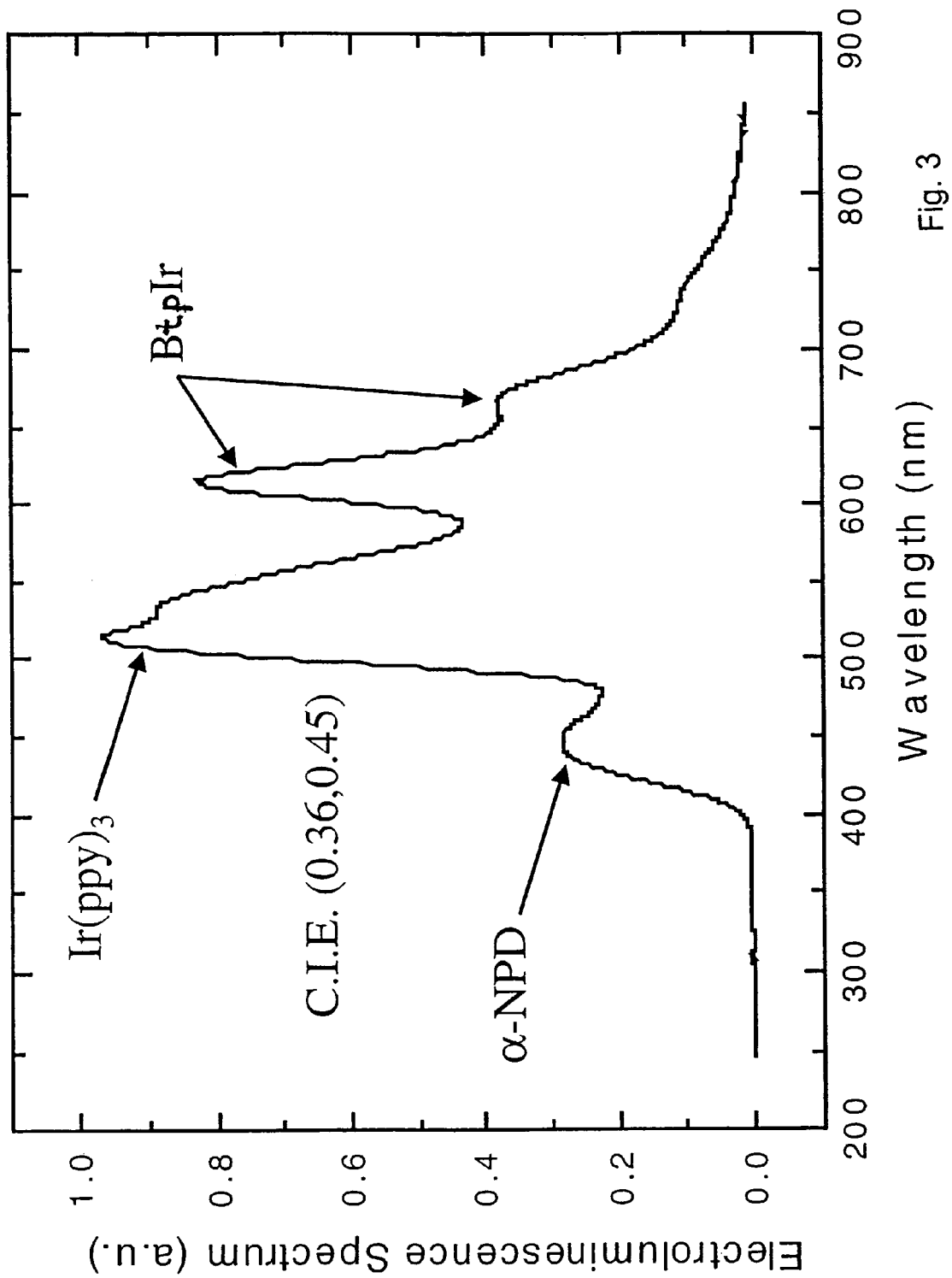
FIG. 3 shows the electroluminescence spectrum as a function of wavelength for one embodiment of the invention.
Figure 4:
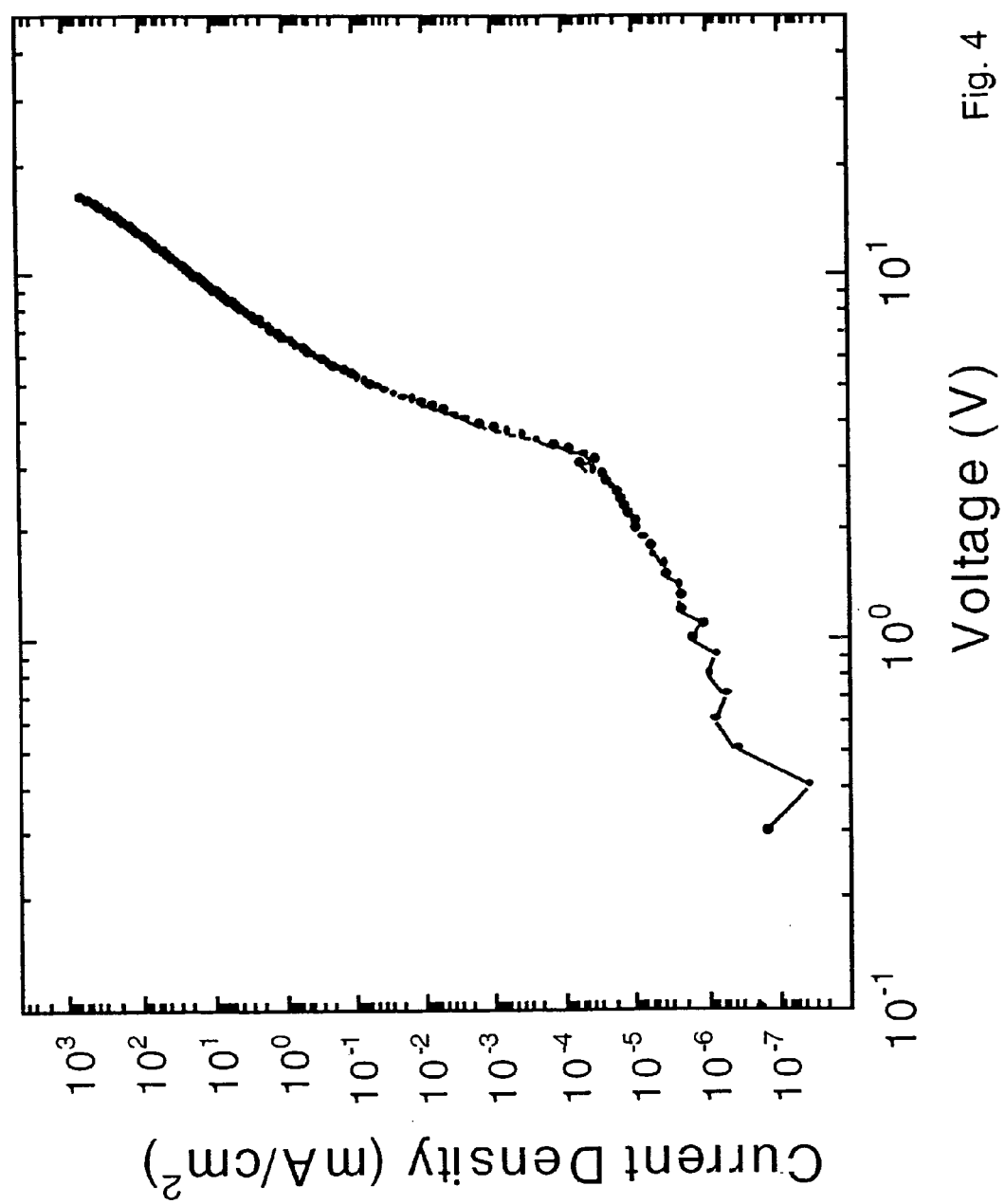
FIG. 4 shows the current density as a function of voltage of one embodiment of the invention.
Figure 5:
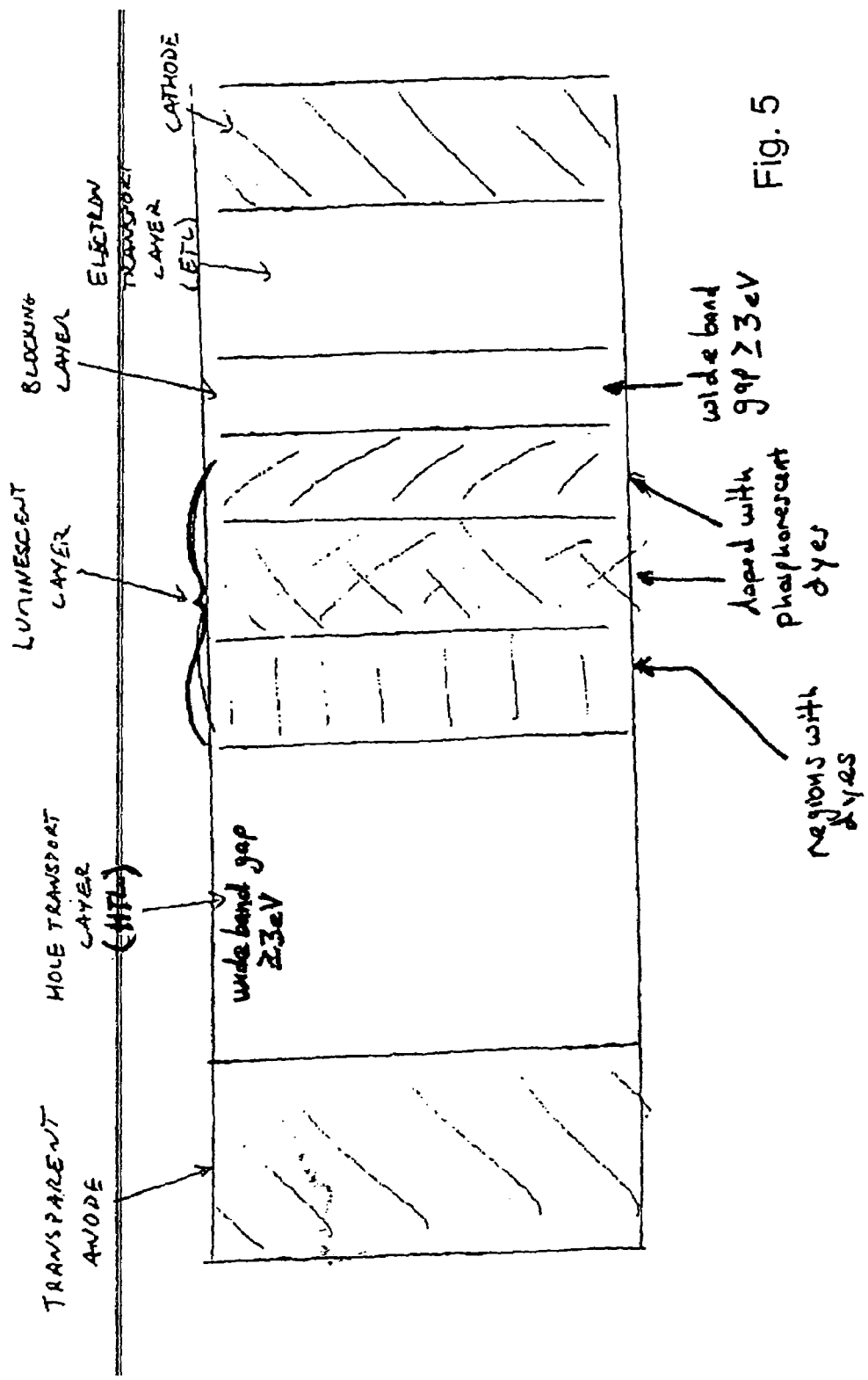
FIG. 5 shows a schematic representation of another embodiment of an OLED structure according to the present invention.
Figure 6:
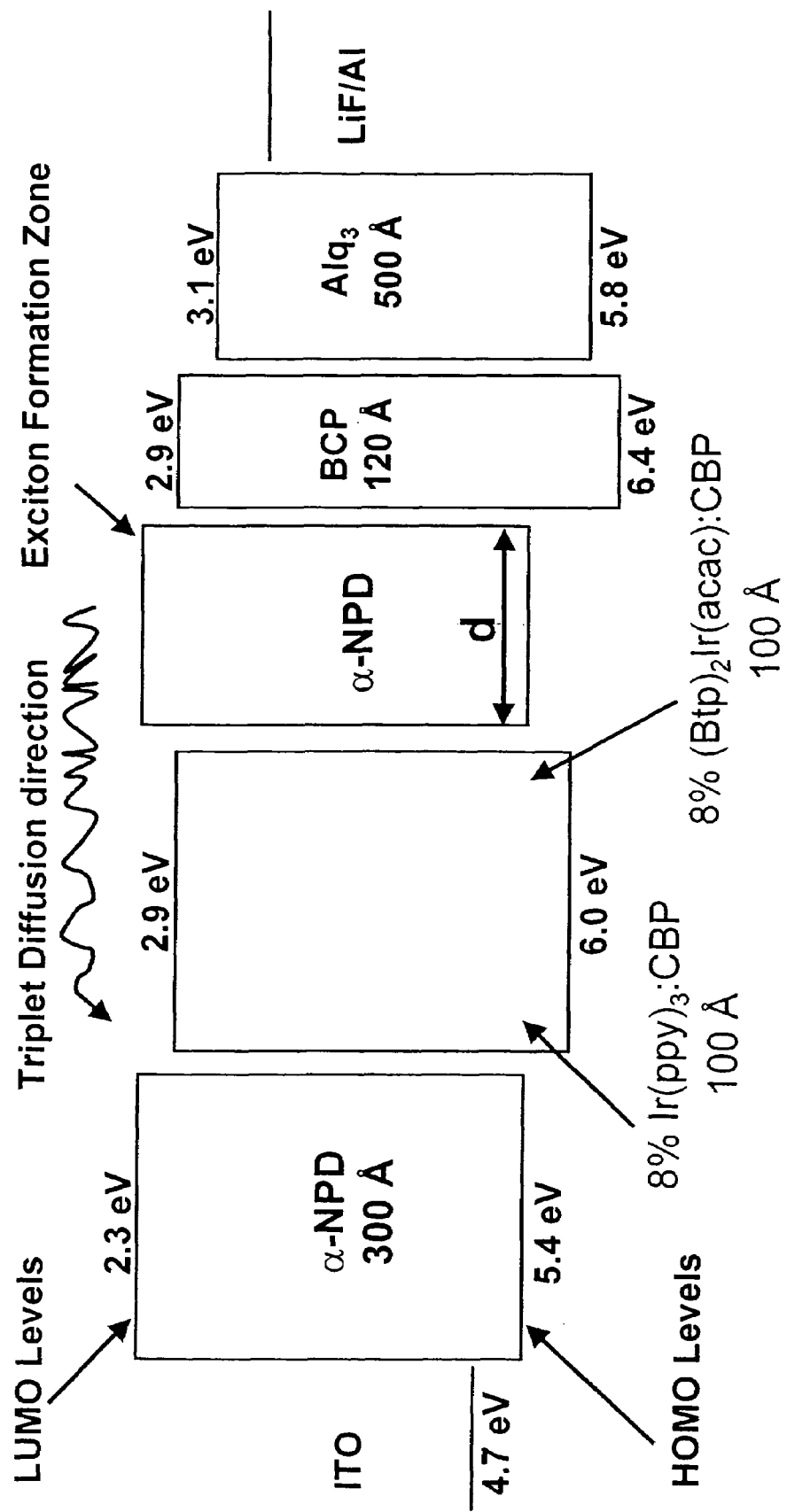
FIG. 6 shows a schematic representation of the energy levels of another embodiment of an OLED structure according to the present invention.
Figure 7:
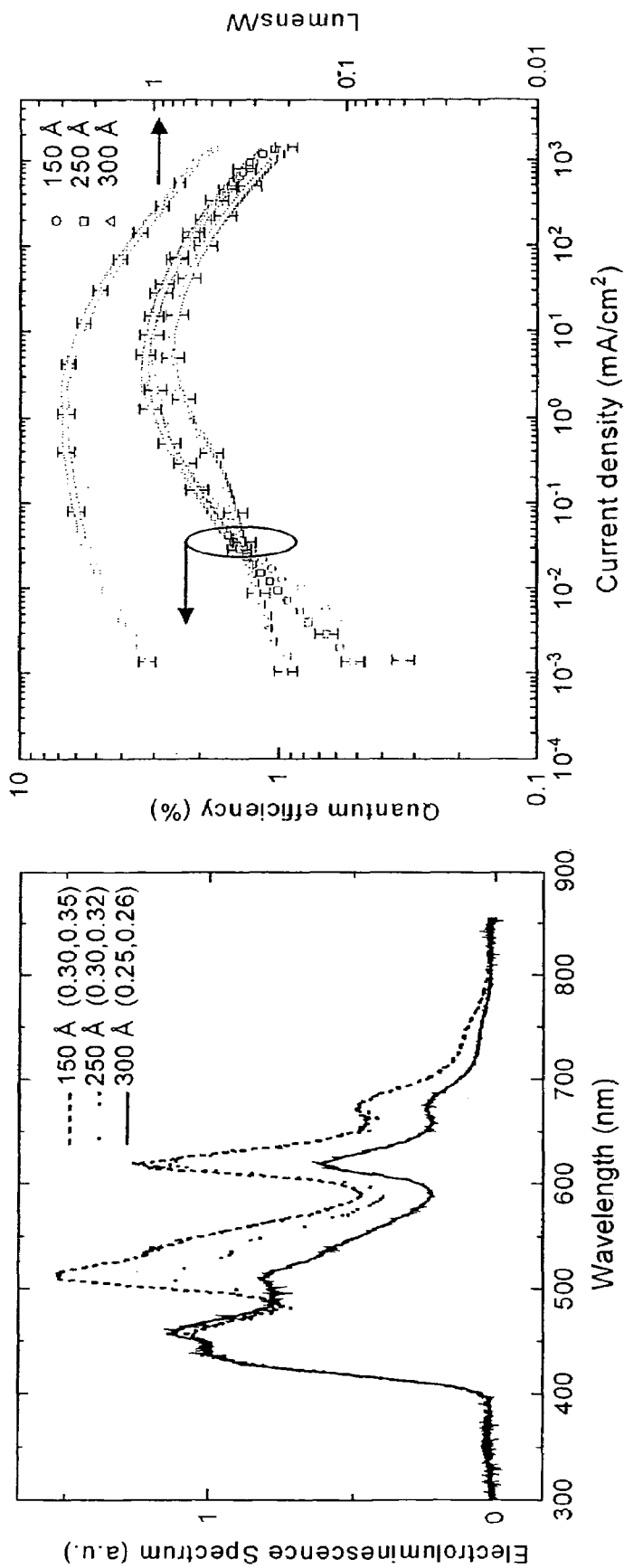
FIG. 7 shows (a) the electroluminescence spectrum versus wavelength and (b) the quantum efficiency and luminance versus current density for three devices fabricated according the structure shown in FIG. 6.
Figure 8:
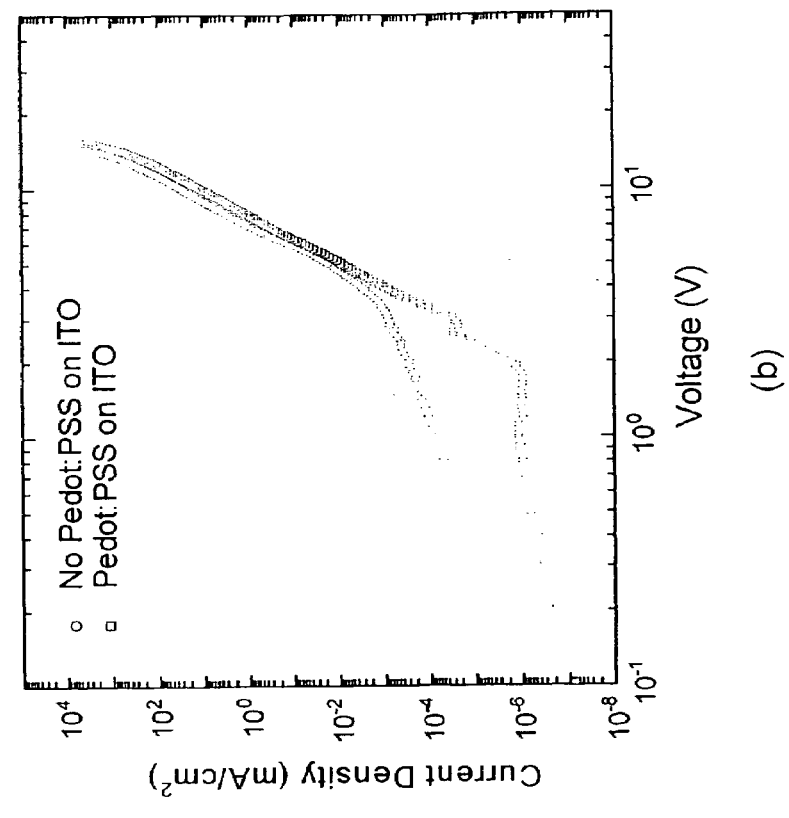
FIG. 8 shows (a) the quantum efficiency and luminance versus current density with and without a PEDOT:PSS layer on the ITO layer, and (b) the current density with and without a PEDOT:PSS layer on the ITO layer, according to the embodiment of the device structure represented in FIG. 9.
Figure 8:
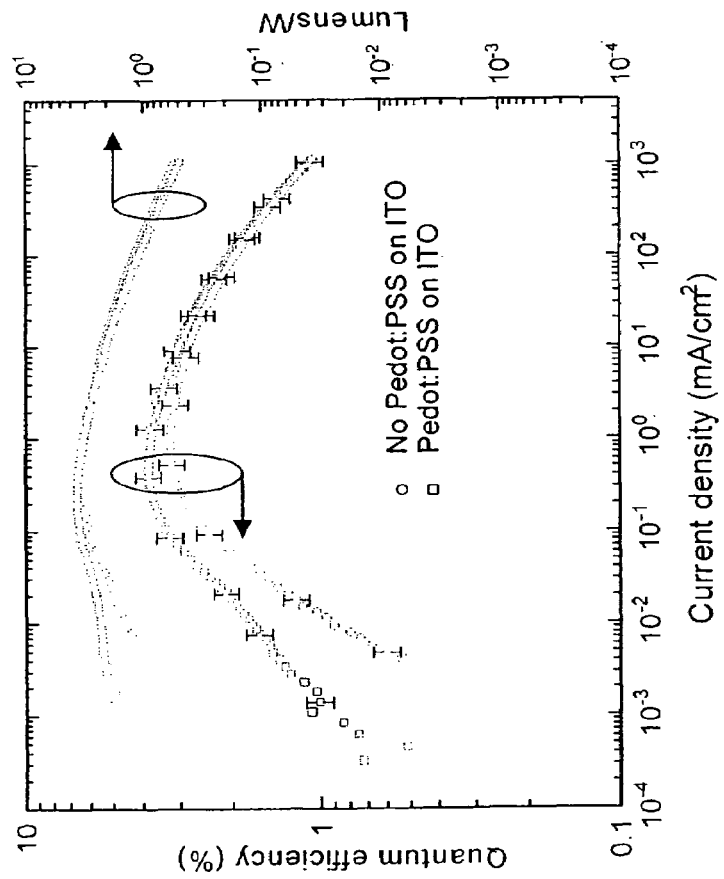

The present invention will now be described in detail for specific preferred embodiments of the invention. These embodiments are intended only as illustrative examples and the invention is not to be limited thereto.

The present invention provides a multi-emissive layer electrophosphorescent OLED that can take advantage of the diffusion of triplet excitons to produce devices with high power and quantum efficiencies. The device color can be tuned by varying the thickness and the dopant concentrations in each layer or band, and by introducing exciton blocking layers between emissive layers.

Phosphorescent light emission is obtained from triplet excitons, which typically have long diffusion lengths, often greater than 140 nm. Theoretically, several phosphorescent emitters doped in a host material can generate different colored light from each of the different phosphorescent emitters. For example, fac-tris(2-phenylpyridine)iridium ("Ir(ppy)$_3$") is a green-emitting phosphor and may be combined with a red-emitting compound, such as iridium (III) bis(benzothienylpyridine) acetylacetonate ("Btp$_2$Ir(acac)"), in a suitable host material to produce a white-light-emitting emissive layer.

The host material of the emissive region may be selected to have a wide energy gap to impede cascade energy transfer between or among the various phosphorescent dopants. Cascade energy transfer is a term used to describe transfer in a stepwise process from higher energy excitons to lower energy excitons, for example, from higher energy triplet excitons to the lowest energy triplet excitons. Cascade energy transfer between the phosphorescent dopants can occur when a plurality of phosphorescent dopants are mixed together in the same band or region within a common host material, and can be avoided or minimized either by choosing a host material that impedes cascade energy transfer or by doping the phosphorescent dopants in separate bands within the host material of the emissive region. Otherwise, the process of cascade energy transfer can cause high-energy excitons that would is emit visible light to transfer their energy to other lower-energy excitons that emit only non-visible heat, decreasing the efficiency of an OLED. Therefore, impeding or avoiding cascade energy transfer is important in fabricating efficient OLEDs.

The control of the diffusion of triplet excitons provides a means for obtaining the desired color balance. Triplets have lifetimes that are several orders of magnitude longer than singlet excitons, hence they have longer diffusion lengths, allowing emissive layers to be >10 nm thick. Hence, to achieve a desired emission color, the thickness of each layer doped with a different phosphor can be adjusted to serve as a recombination zone of the appropriate fraction of excitons initially formed at the HTL/EMR interface. The color of light emission from an emissive region can be tuned by varying the concentration of each phosphorescent dopant. Furthermore, the phosphorescent dopants may be stratified in bands within the emission region, allowing the thickness of each phosphorescent dopant band to be varied independently from the other phosphorescent dopant bands, providing a method of controlling the intensity of light emission from each phosphorescent dopant independently. Finally, phosphorescent dopants may be combined with fluorescent light emitting dyes or with a fluorescent emission from a separate fluorescent emission layer.

By varying the concentration of the dopants, the location of the different color regions with respect to the HTL interface, where exciton formation generally occurs, the thicknesses of each of the layers, and by inserting an exciton blocking layer between emissive layers, the CIE coordinates of the OLED emission can be tuned over a wide range. However, it is preferable that the phosphors that trap excitons most readily should be positioned farthest from the exciton formation region. Typically, this may be accomplished by positioning the phosphors with the lowest triplet energy farthest from the exciton formation region. However, the efficiency of the energy transfer from the host material to an emitter may also be an important consideration. If the efficiency of the energy transfer from the host material to a particular emitter is high, the band containing that emitter may be placed farther from the exciton formation region. Conversely, if the efficiency of the energy transfer from the host material to a particular emitter is low, then the band containing that emitter may be placed closer to the exciton formation region. Thus, it may be important to consider both the triplet energy for the various emitters as well as the efficiency of the energy transfer from the host material to the various emitters. For example, rather than ordering the bands of the emitters in the order of highest triplet energy, intermediate triplet energy, to lowest triplet energy, the bands of emitters may in the order of highest triplet energy, lowest triplet energy, intermediate triplet energy if the emitter with the intermediate triplet energy shows a high efficiency for the energy transfer from the host material. This ensures that the excitons can diffuse throughout the luminescent region, producing the desired output color balance.

An emissive region with two or more phosphorescent dopants can be tuned to produce any color of light, including white light. The low cost, high efficiency and brightness of such a white-light OLED make it suitable for use as backlight for a typical liquid crystal display, as a source of lighting in a home or office, or for a thin, flexible monochrome display. A monochrome OLED could be developed that would achieve a distinctive color for advertising purposes. A transparent, color-selectable OLED could be used as one of the OLEDs in a full-color display having several stacked, individually addressable organic light emitting devices, providing a method for achieving an inexpensive but efficient full-color organic display or transparent organic display.

In one embodiment of the invention, at least one phosphorescent dopant and at least one fluorescent material can be used. The phosphorescent dopants can be intermixed within the same region in the emissive layer. More preferably, the emissive materials are doped into stratified layers or bands within the emission region. The long diffusion lengths and lifetimes of triplet excitons allow the thickness of the stratified layers to be adjusted, so as to control the intensity of the light emitted from each of the stratified phosphorescent bands within the emissive region. In contrast, it was typical in the prior art to achieve color tuning in fluorescent devices by varying energy transfer efficiency or precisely controlling fluorescent dopant concentration, and both of these methods tends to reduce device efficiency. Furthermore, the use of multiple phosphorescent emitters in an emissive region offers greater flexibility in the choice of color compared to a single fluorescent emission layer. Multiple fluorescent organic light emitting devices could be stacked to achieve flexibility in color, but this would result typically in reduced efficiency and greater fabrication cost than the use of multiple phosphorescent emitters in an emissive region.

The hole transporting materials, the exciton blocking layers, the electron transporting materials and the phosphorescent dopant materials may each be selected from a vast array of materials known in the art, provided that the relative energy levels of these materials, when used in combination, have relative values as described herein. Representative materials, for example, of the hole injecting materials, the electron transporting materials, and the phosphorescent materials include the types of materials such as disclosed in M. A. Baldo et al., Nature, vol. 395, 151 (1998); D. F. O'Brien et al., Appl. Phys. Lett., vol. 74, 442 (1999); M. A. Baldo et al., Appl. Phys. Lett., vol. 75, 4 (1999); T. Tsutsui et al., Japanese. J. Appl. Phys., Part 2, vol. 38, L 1502 (1999); M. J. Yang et al., Japanese J. Appl. Phys., Part 2, vol. 39, L828 (2000); and C. L. Lee et al., Appl. Phys. Lett., vol. 77, 2280 (2000); Baldo et al., Physical Review B 422-428 (1999); Kwong et al., Chemistry of Materials, vol. 11, 3709-3713 (1999); Djurovich et al., Polymer Preprints, vol. 41, No. 1, 770 (2000). The phosphorescent materials for use in the present device are typically organo-metallic compounds. The organo-metallic phosphorescent materials may be selected from those taught in co-pending applications U.S. Ser. No. 08/980,986, filed Jun. 18, 2001 and Ser. No. 09/978,455, filed Oct. 16, 2001, each of which is incorporated herein in its entirety by reference.

The ETL materials may include, in particular, an aryl-substituted oxadiazole, an aryl-substituted triazole, an aryl-substituted phenanthroline, a benzoxazoles or a benzthiazole compound, for example, 1,3-bis(N,N-t-butyl-phenyl)-1,3,4-oxadiazole ("OXD-7"); 3-phenyl-4-(1'-naphthyl)-5-phenyl-1,2,4-triazole ("TAZ"); 2,9-dimethyl-4,7-diphenyl-phenanthroline ("BCP"); bis(2-(2-hydroxyphenyl)-benzoxazolate) zinc; or bis(2-(2-hydroxyphenyl)-benzthiazolate)zinc; such as disclosed in C. Adachi et al., Appl. Phys. Lett., vol. 77, 904 (2000). Other electron transporting materials include (4-biphenyl)(4-terthutylphenyl)oxidiazole (PDB) and aluminum tris(8-hydroxyquinolate) (Alq3).

The material of a hole transporting layer is selected to transport holes from an anode to an emission region of the device. A preferred class of materials for use in the HTL are triaryl amines in various forms which show high hole mobilities ($\sim 10^{-3}$ $cm^2/Vs$). An example of a material suitable as a hole transporting layer is 4,4'-bis[N-(naphthyl)-N-phenyl-amino]biphenyl ($\alpha$-NPD) with a hole mobility of about $5 \times 10^{-4}$ $cm^2/V$ sec. Other examples include N,N'-bis(3-methylphenyl)-N,N'-diphenyl-[1,1'-biphenyl]4,4'-diamine (TPD) with a hole mobility of about $9 \times 10^{-4}$ $cm^2/V$ sec, 4,4'-bis[N-(2-naphthyl)-N-phenyl-amino]biphenyl ($\beta$-NPD), 4,4'-bis[N,N'-(3-tolyl)amino]-3,3'-dimethylbiphenyl (M14), 4,4',4"-tris(30methylphenylphenylamino)triphenylamine (MTDATA), 4,4'-bis[N,N'-(3-tolyl)amino]-3,3'-dimethylbiphenyl (HMTPD), 3,3'-Dimethyl-$N^4$,$N^4$,$N^{4'}$,$N^{4'}$-tetra-p-tolyl-biphenyl-4,4'-diamine (R854), and 4,4'-N,N'-dicarbazole-biphenyl (CBP). Additional suitable hole transporting materials are known in the art, and examples of materials that may be suitable for the hole transporting layer can be found in U.S. Pat. No. 5,707,745, which is incorporated herein by reference.

In addition to the small molecules discussed above, the matrix may comprise a polymer or polymer blend. In one embodiment, the emissive material(s) are added as a free molecule, i.e. not bound to the polymer, but dissolved in a polymer "solvent". A preferred polymer for use as a matrix material is poly(9-vinylcalbazole) (PVK). In an alternative embodiment, the emitter is part of the repeating unit of the polymer, for example Dow's polyfluorene materials. Both fluorescent and phosphorescent emitters may be appended to polymer chains and used to make OLEDs. Layers in a device comprising a polymeric matrix are typically deposited by spin-coating.

The devices of the present invention may comprise additional layers, such as an exciton blocking layer (EBL), a hole blocking layer (HBL) or a hole injection layer (HIL). One embodiment of the invention uses an exciton blocking layer that blocks exciton diffusion so as to improve overall device efficiency, such as disclosed in U.S. Pat. No. 6,097,147, which is incorporated herein in its entirety by reference. Such an exciton blocking layer confines electrically-generated excitons within an emissive layer.

In still other embodiments of the invention, a hole injecting layer may be present between the anode layer and the hole transporting layer. The hole injecting materials of the present invention may be characterized as materials that planarize or wet the anode surface so as to provide efficient hole injection from the anode into the hole injecting material. The hole injecting materials of the present invention are further characterized as having HOMO (Highest Occupied Molecular Orbital) energy levels that favorably match up, as defined by their herein-described relative IP energies, with the adjacent anode layer on one side of the HIL layer and the phosphorescent-doped electron transporting layer on the opposite side of the HIL.

Preferred properties for the HIL material are such that holes can be efficiently injected from the anode into the HIL material. In particular, the HIL material preferably has an IP not more than about 0.7 eV greater that the IP of the anode material. More preferably, the HIL material has an IP not more than about 0.5 eV greater than the anode material.

The HIL materials, while still being hole transporting materials, are distinguished from conventional hole transporting materials that are typically used in the hole transporting layer of an OLED in that such HIL materials have a hole mobility that may be substantially less than the hole mobility of conventional hole transporting materials. For example, m-MTDATA has been identified as effective in promoting injection of holes from ITO into the HTL consisting of, for example α-NPD or TPD. Possibly, the HIL effectively injects holes due to a reduction of the HTL HOMO level/ITO offset energy, or to wetting of the ITO surface. The HIL material m-MTDATA is believed to have a hole mobility of about $3 \times 10^{-5}$ cm$^2$/Vsec as compared with a hole mobility of about $5 \times 10^{-4}$ cm$^2$/V sec and $9 \times 10^{-4}$ cm$^2$/V sec of α-NPD and TPD, respectively. Thus, the m-MTDATA material has a hole mobility more than an order of magnitude less than the commonly used HTL materials α-NPD and TPD.

Other HIL materials include phthalocyanine compounds, such as copper phthalocyanine, or still other materials, including polymeric materials such as poly-3,4-ethylenedioxythiophene ("PEDOT") or poly(ethene-dioxythiophene):poly(styrene sulphonic acid) (PEDOT:PSS), which are effective in promoting injection of holes from the anode into the HIL material and subsequently into the HTL.

The thickness of the HIL of the present invention needs to be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

Suitable electrode (i.e., anode and cathode) materials include conductive materials such as a metal, a metal alloy or an electrically conductive oxide such as ITO, which are connected to electrical contacts. The deposition of electrical contacts may be accomplished by vapor deposition or other suitable metal deposition techniques. These electrical contacts may be made, for example, from indium, magnesium, platinum, gold, silver or combinations such as Ti/Pt/Au, Cr/Au or Mg/Ag.

When depositing the top electrode layer (i.e., the cathode or the anode, typically the cathode), that is, the electrode on the side of the OLED furthest from the substrate, damage to the organic layers should be avoided. For example, organic layers should not be heated above their glass transition temperature. Top electrodes are preferably deposited from a direction substantially perpendicular to the substrate.

The electrode that functions as the anode preferably comprises high work function metals ($\geq 4.5$ eV), or a transparent electrically conductive oxide, such as indium tin oxide (ITO), zinc tin oxide, or the like.

In preferred embodiments, the cathode is preferably a low work function, electron-injecting material, such as a metal layer. Preferably, the cathode material has a work function that is less than about 4 electron volts. The metal cathode layer may be comprised of a substantially thicker metal layer if the cathode layer is opaque. If the cathode is intended to be transparent, a thin low-work function metal may be used in combination with a transparent electrically conductive oxide, such as ITO. Such transparent cathodes may have a metal layer with a thickness of 50-400 Å, preferably about 100 Å. A transparent cathode, such as LiF/Al may also be used.

For top-emitting devices, a transparent cathode such as disclosed in U.S. Pat. No. 5,703,436, or co-pending patent applications U.S. Ser. Nos. 08/964,863 and 09/054,707, each incorporated herein by reference, may be used. A transparent cathode has light transmission characteristics such that the OLED has an optical transmission of at least about 50%. Preferably, the transparent cathode has light transmission characteristics that permit the OLED to have an optical transmission of at least about 70%, more preferably, at least about 85%.

Substrates according to the present invention may be opaque or substantially transparent, rigid or flexible, and/or plastic, metal or glass. Although not limited to the thickness ranges recited herein, the substrate may be as thin as 10 μm if present as a flexible plastic or metal foil substrate, or substantially thicker if present as a rigid, transparent or opaque substrate, or if the substrate is made of silicon.

One representative embodiment of the OLED structure of the present invention is shown in FIG. 1. The device includes a glass substrate, an anode layer (ITO), a hole transporting layer (α-NPD), a hole blocking layer (BCP), an emission layer comprising a host (TAZ) and two phosphorescent dopants in separate bands or layers within the emission layer (Ir(ppy)$_3$ and Btp$_2$Ir(acac)), an electron transporting layer comprising tris(8-hydroxyquinoline)aluminum ("Alq$_3$"), and a cathode layer, wherein the cathode layer comprises a layer of lithium fluoride ("LiF") and a layer of aluminum ("Al"). Light emission from the emissive layer occurs when a voltage is applied across the cathode layer and the anode layer. The materials used in the device are an example of one embodiment of the invention, and may include any suitable materials which fulfill the function(s) of the respective layer(s).

The term "region" may be used in some cases herein to refer to a region comprised of multiple layers or comprised of differently doped layers, alternatively referred to as bands, within the same region. For example, the emissive region may be comprised of a single host material doped by a plurality of phosphorescent dopants with each phosphorescent dopant contained in a separate and distinct band, wherein the doped band within the emission region may be considered as a separate and distinct layer of host material with each separate and distinct layer being doped by a different phosphorescent dopant. Also, the host material in one or more of these bands may be different from one band to the next. Alternatively, the emissive region may be comprised of a separate fluorescent layer and a host layer doped by one or more phosphorescent dopants. In yet another embodiment, the emission region may comprise a host material doped by phosphorescent dopants, but the phosphorescent dopants may not be doped into separate and distinct bands. Rather, the doped region of one phosphorescent dopant may overlap the doped region of another phosphorescent dopant or the doped region of one phosphorescent dopant may be contained in its entirety within the doped region of another phosphorescent dopant. In fact, multiple layers may be used to achieve a combination of benefits, improving overall device efficiency.

The materials listed below are provided for illustrative purposes only. The device is typically manufactured upon a substrate that may be a transparent or opaque material, such as glass, quartz, sapphire or plastic. The substrate may be, for example, rigid, flexible, conformable, and/or shaped to a desired configuration. For transparent OLEDs or top-emitting OLEDs, a transparent cathode such as disclosed in U.S. Pat. No. 5,703,436, or co-pending U.S. patent applications Ser. Nos. 08/964,863 and 09/054,707, may be used. A transparent cathode has light transmission characteristics such that the OLED has an optical transmission of at least about 50%. Preferably, the transparent cathode has optical transmission characteristics that permit the OLED to have an optical transmission of at least about 70%, more preferably, at least about 85%.

A top-emitting device is one for which light is produced only out of the top of the device and not through the substrate. The substrate and bottom electrode of such top-emitting devices may each be comprised of opaque and/or reflective materials, for example, with the electrode being a reflective thick metal layer. The substrate is typically referred to as being at the bottom of the device.

The deposition techniques for any of the above-listed layers and materials are well-known in the art. For example, a representative method of depositing the OLED layers is by thermal evaporation or organic vapor phase deposition (OVPD) such as disclosed in Baldo et al., "Organic Vapor Phase Deposition," *Advanced Materials*, vol. 10, no. 18 (1998) pp. 1505-1514. If a polymer layer is used, the polymer may be spin coated. One representative method of depositing metal layers is by thermal or electron-beam evaporation. A representative method of depositing indium tin oxide is by electron-beam evaporation or sputtering.

Thus, in one embodiment of the present invention, an electrophosphorescent OLED comprises an emissive region including a plurality of phosphorescent dopants, wherein each phosphorescent dopant is present in a band within the host emissive region, with the thickness of each band, the location of each band, and the concentration of each phosphorescent dopant within each band is adjusted such that a desired color and brightness of light are emitted from the OLED. In specific embodiments of the invention, the bands may be separate or overlapping. As one embodiment of the present invention, overlapping bands may employ a host material which impedes cascade energy transfer, improving device efficiency.

In one specific embodiment, the excitons may form, in an exciton formation zone, on one side of a hole blocking layer and diffuse through the hole blocking layer and into the emission region. Alternatively, the excitons may form either on the anode side of the emission layer or on the cathode side of the emission layer. The invention embodies efficient design and fabrication of devices that optimize the brightness, efficiency, color or a combination of these characteristics of the device by layering and ordering the layers within the emission region with respect to the location of the exciton formation zone.

An alternative embodiment of the present invention comprises an emissive region including a plurality of phosphorescent dopants, wherein each of the phosphorescent dopants is mixed in at least a portion of the host material with one or more other phosphorescent dopants, wherein the host material is chosen to reduce cascade energy transfer, and the band thickness and concentration for each phosphorescent dopant is independently selected such that a desired color of light is emitted from the electrophosphorescent OLED.

The present invention may be used to provide stable, efficient, high brightness, monochromatic, multicolor, or full-color, flat panel displays of any size. The images created on such displays could be text or illustrations in full-color, in any resolution depending on the size of the individual OLEDs. Display devices of the present invention are therefore appropriate for an extremely wide variety of applications including billboards and signs, computer monitors or computer displays, and communications devices such as telephones, televisions, large area wall screens, theater screens and stadium screens. The structures described herein are included, for example, in a plurality of pixels in a light emitting device or as part of a single-pixel, flat panel backlight device or general light source for a room or office. Moreover, the structures described herein may be used as part of a laser device. As part of a laser device, the OLED would be incorporated into the laser as a light source. The present invention both has high efficiency and is capable of being tuned to transmit a specifically desired wavelength of light, which are both desirable characteristics for a laser light source. In addition, the light source could be incorporated into an organic laser inexpensively as a vacuum-deposited OLED.

Because of the exceptionally high luminous efficiencies that are possible for phosphorescent-based OLEDs, as compared with OLEDs generally, and especially with respect to conventional inorganic LEDs, the phosphorescent-based OLEDs of the present invention may also be used as a light source for illumination applications. Such light sources could replace conventional incandescent or fluorescent lamps for certain types of illumination applications. Such phosphorescence-based OLEDs could be used, for example, in large backplane light sources that produce illumination of a desired color, including white light.

The devices disclosed in the following patents or co-pending patent applications, each of which is incorporated herein in its entirety, may benefit from incorporation of the organic light emitting devices-disclosed herein. U.S. Pat. Nos. 5,703,436; 5,707,745; 5,721,160; 5,757,026; 5,757,139; 5,811,833; 5,834,893; 5,844,363; 5,861,219; 5,874,803; 5,917,280; 5,922,396; 5,932,895; 5,953,587; 5,981,306; 5,986,268; 5,986,401; 5,998,803; 6,005,252; 6,013,538; and 6,013,982; and co-pending U.S. patent application Ser. Nos. 08/779,141; 08/821,380; 08/977,205; 08/865,491; and 08/928,800. The materials, methods and apparatus disclosed in these patents and co-pending patent applications may also be used to prepare the OLEDs of the present invention.

There may be substantial variation of the type, number, thickness and order of the layers that are present, dependent on whether an inverted sequence of OLED layers is present, or whether still other design variations are used. Those with skill in the art may recognize various modifications to the embodiments of the invention described and illustrated herein. Such modifications are intended to be covered by the spirit and scope of the present invention. That is, while the invention has been described in detail with reference to certain embodiments, it will be recognized by those skilled in the art that there are other embodiments of the invention within the spirit and scope of the claims.

This invention will now be described in detail with respect to showing how certain specific representative embodiments thereof can be made, the materials, apparatus and process steps being understood as examples that are intended to be illustrative only. In particular, the invention is not intended to be limited to the methods, materials, conditions, process parameters, apparatus and the like specifically recited herein.

EXAMPLES OF THE INVENTION

In a representative embodiment of the present invention, organic layers were deposited by high vacuum ($10^{-6}$ Torr) thermal evaporation onto a clean glass substrate precoated with indium tin oxide (ITO), which was used as the anode of the device and which had a sheet resistance of 20 $\Omega$/square. Prior to film deposition, the substrate was solvent degreased and cleaned in a UV-ozone chamber before it was loaded into the deposition system. Poly(ethylene-dioxythiophene):poly(styrene sulphonic acid) (PEDOT:PSS), used to decrease OLED leakage current and to increase OLED fabrication yield, was spun onto the ITO at 4000 rpm for 40 seconds and then baked for 15 mins at 120° C., attaining an approximate thickness of 40 nm.

Device 1. One example of the invention is an efficient, organic white-light-emitting device, comprising, in sequence from the top (cathode side), an aluminum cathode layer (500 nm), a thin LiF electron injecting layer (0.5 nm), an $Alq_3$ electron transporting layer (50 nm), a vacuum-deposited emissive region of TAZ (30 nm), doped with a 20 nm thick band of phosphorescent red-emitting $Btp_2Ir(acac)$ at a concentration of 8 wt %, and a 10 nm thick band of phosphorescent green-emitting $Ir(ppy)_3$ at a concentration of 8 wt %. The emissive region was separated from the hole transporting layer by a hole-blocking layer of 2,9-dimethyl-4,7-diphenyl-1,10-phenanthroline (BCP) (6 nm), and a layer of α-NPD (50 nm), which had been vacuum-deposited onto the solvent degreased and cleaned layer of ITO.

It is believed that in Device 1, excitons are formed in the α-NPD layer and then a large fraction of the excitons are transferred into the TAZ layer across the BCP hole blocking layer. A significant fraction of the excitons cause fluorescent emission to be produced directly from the α-NPD host material. The excitons in the TAZ layer are subsequently transferred from the TAZ to the phosphorescent dopants, resulting in electro-phosphorescence from both $Btp_2Ir(acac)$ and $Ir(ppy)_3$. By selecting the layer thicknesses as described, white light emission results.

Device 1 produced a substantially white light emission with Commission Internationale d'Eclairage (CIE) chromaticity coordinates of(X=0.36, Y=0.45). The spectrum was largely insensitive to the drive current, and the device had a maximum luminance of about $10^4$ $cd/m^2$ at about 600 $mA/cm^2$. At aluminance of 100 $cd/m^2$, the quantum efficiency was about 2% and about 3 lm/W, respectively. It is believed that the high luminance and high quantum efficiency of this device may be attributed in substantial part to the presence of the BCP hole blocking layer that was present between the hole transporting α-NPD layer and the phosphorescent-doped TAZ layer. In particular, it is believed that the BCP layer substantially forces the hole-electron recombination to take place in the α-NPD layer with insignificant loss of holes through the BCP layer. The BCP layer then allows a large fraction of the triplet excitons thus formed to diffuse into the TAZ layer, so as to produce triplet excitons on the $Btp_2Ir(acac)$ and $Ir(ppy)_3$ molecules, which then emit visible light by phosphorescence.

It is believed that the BCP layer thus functions simultaneously as a hole blocking layer and as an exciton transporting layer, which is present between the phosphorescent zone of the device and the hole transporting region of the device where substantially all hole-electron recombination occurs, but where only a small fraction of the luminescence is produced as fluorescent emission. By suitably selecting the materials used in each layer, and then adjusting the layer thicknesses and the phosphorescent dopant concentrations, the emission may be is tuned to produce substantially any desired color. For example, by placing the phosphorescent dopants having the lowest energy transfer efficiency in a band immediately adjacent, or proximal to the hole-electron recombination zone, also referred to as the exciton formation zone, of the device and placing the phosphorescent dopants having the highest energy transfer efficiency in a band distal from the hole-electron recombination zone of the device, the relative emissive contribution of each phosphorescent dopant, each producing a different color of light emission, may be controlled by adjusting the thickness of each layer and concentration of dopant in each layer, as required to generate a desired color of light emission from the electrophosphorescent OLED. It is believed that such devices are commercially practical only if they are fabricated using at least one phosphorescent dopant, because the triplet excitons that are responsible for phosphorescence have diffusion lengths of a hundred nanometers or more, whereas fluorescent, singlet excitons have diffusion lengths that seldom exceed ten nanometers. Therefore, a device using triplet excitons can achieve the brightness and efficiency necessary for a commercially useful device.

Device 2. In another example of the invention blue, green and red phosphorescent emissive layers were combined in a multi-emissive-layer, organic light-emitting device to produce efficient white light. A blue phosphor iridium(III) bis(4,6-di-fluorophenyl)-pyridinato-$N,C^2$) picolinate ("FIrpic") doped into 4,4'-N,N'-dicarbazole-biphenyl (CBP) was used as the blue emissive band, fac tris(2-phenylpyridine)iridium ($Ir(ppy)_3$) doped into CBP as the green emissive band and bis(2-(2'-benzo[4,5-a]thienyl) pyridinato-$N,C^3$)iridium(acetylacetonate) ($Btp_2Ir(acac)$) doped into CBP as the red emissive band.

Another embodiment of this invention includes the process for fabricating a white light emitting OLED, having blue, green and red phosphorescent emissive layers combined in a multi-emissive-layer. In Device 2, OLEDs were grown on a glass substrate pre-coated with an indium-tin-oxide (ITO) layer having a sheet resistance of 20-$\Omega$/sq. Prior to any organic layer deposition or coating, the substrate was degreased with solvents and then treated with an oxygen plasma for 8 minutes with 20 W at 150 mTorr. Poly (ethylene-dioxythiophene)/poly(styrene sulphonic acid) (PEDOT:PSS) was spun onto the ITO at 4000 rpm for 40 s and then baked for 10 mins. at 120° C. PEDOT:PSS was used to decrease the leakage current. [D. J. Milliron, I. G. Hill, C. Shen, A. Kahn and J. Schwartz, J. Appl. Phys. 87, 572 (2000); and T. M. Brown and F. Cacialli, IEE Proc.-Optoelectron 148, 74 (2001)] All small molecule organic layers were consecutively thermally evaporated at a base pressure of $\leq 10^{-6}$ Torr. First, a 400 nm-thick 4,4'-bis[N-(1-napthyl)-N-phenyl-amino]biphenyl ($\alpha$-NPD) hole transport layer (HTL) was deposited. Next, an emissive region (EMR) consisting of a 10 nm-thick layer of 4,4'-N,N'-dicarbazole-biphenyl (CBP) doped with 8 wt. % of iridium(III)bis(4,6-di-fluorophenyl)-pyridinato-N,$C^2$) picolinate (FIrpic), followed by a 10 nm-thick CBP layer doped with 8 wt. % bis(2-(2'-benzo[4,5-a]thienyl)pyridinato-N,$C^3$)iridium (acetylacetonate) $Btp_2Ir(acac)$ layer and then by a 10 nm-thick layer of CBP doped with 8 wt. % fac tris(2-phenylpyridine)iridium ($Ir(ppy)_3$) was grown. The emission color and device efficiency was found to depend on the order in which the layers were doped, and white emission was obtained using the process described here. A 10 nm-thick 2,9-dimethyl-4,7-diphenyl-1,10-phenanthroline (BCP) electron transporting/hole blocking layer (ETL) was the final organic layer deposited. After deposition of the organic layers, the evaporation chamber was vented with nitrogen and the sample was transferred under a nitrogen atmosphere containing $\leq 1$ ppm of water and oxygen to a nitrogen glove box in which a shadow mask with 1 mm-diameter openings was affixed to the sample. Finally, a cathode consisting of a 5 Å-thick LiF layer followed by 100 nm of Al was deposited. The sample was only exposed to air when it was being tested. The device structure is shown in FIG. 9.

Figure 9:
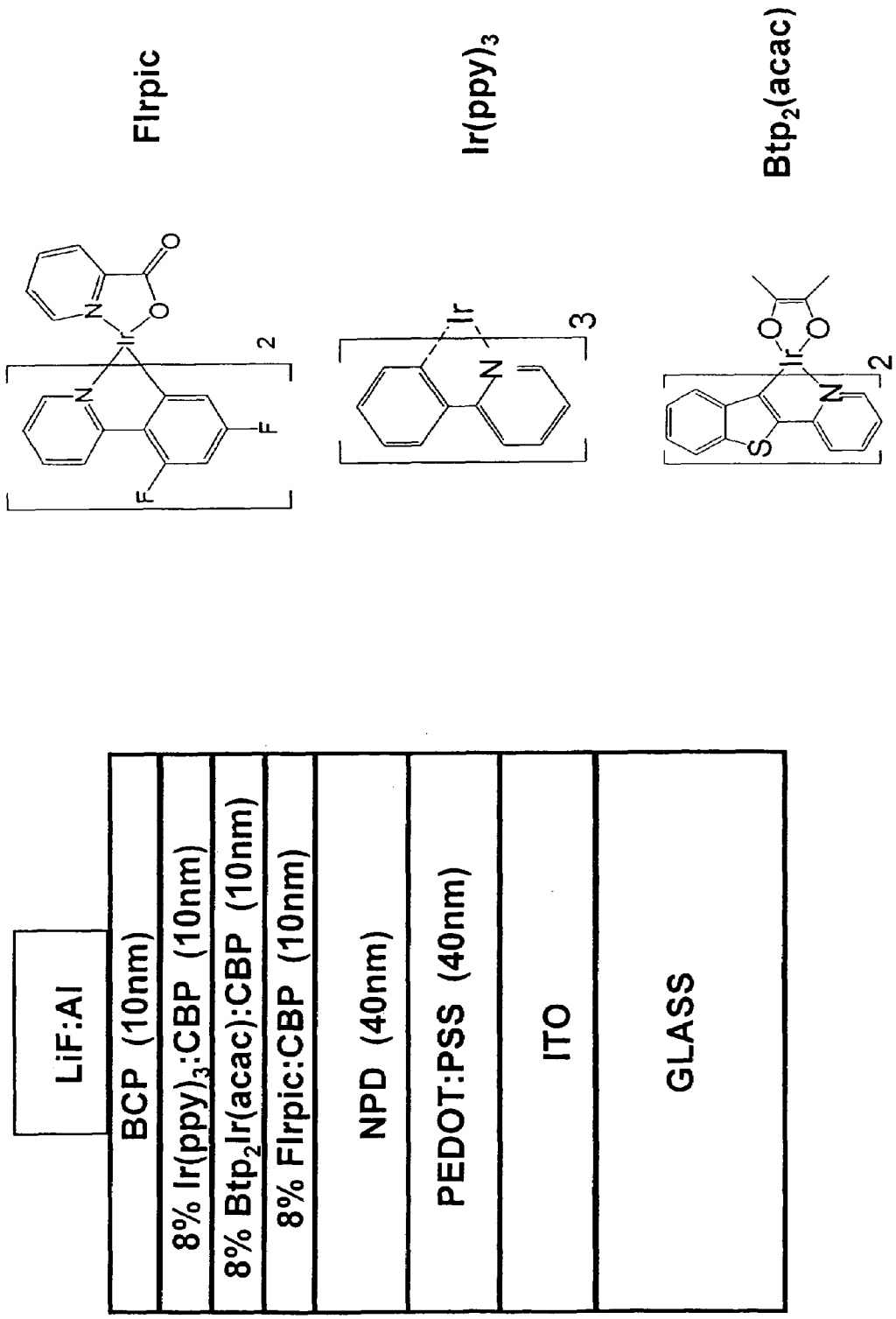
FIG. 9 shows a device structure for one embodiment of the invention.

By balancing the emission of each color component, the device in FIG. 9 can effectively produce white light. The rates of radiative ($k_r$) and non-radiative ($k_{nr}$) recombination, diffusivity constants, and resonance energy transfer rates ($k_{tr}$) between hosts and guests are variables to consider for each layer in the device. By varying the concentration of the dopants, by varying the location of the different color regions with respect to the interface where exciton formation occurs, and by independently changing the thickness of each of the layers, the inventors were able to tune the color/CIE coordinates of a multi-emissive layer OLED.

In Device 2, the concentration of the phosphorescent dopants were kept approximately constant at about (8±2) wt. % in order to achieve both an efficient and thin device. Previous reports indicate that kr and the rate of transfer between the host and is phosphor ($k_{tr}$) is maximized at doping levels between about 6 wt. % and 9 wt. %. [C. Adachi, M. A. Baldo, M. E. Thompson, R. C. Kwong, M. E. Thompson and S. R. Forrest, Appl. Phys. Lett. 78, 1622 (2001); and C. Adachi, M. A. Baldo, S. R. Forrest and M. E. Thompson, Appl. Phys. Lett. 77, 904 (2000)]. Lower doping levels have lower $k_{tr}$ and concentration quenching decreases $k_r$ at higher doping levels.

The long diffusion length of triplets coupled with varying the thickness of the individual emissive bands, and their stacking order allowed for the control of the emission from each of the three emissive bands in Device 2. White light with CIE coordinates of (0.31, 0.35), external quantum efficiency of (4.0±0.4) % and maximum luminance of (36000±4000) cd/m$^2$ were obtained.

In OLED devices, excitons form at the interface between two materials where a build up of excess charge occurs in one of the materials. Excess charge is usually present in one of the materials due to order of magnitude differences in mobility between the materials or large energy barriers to charge transfer at interfaces. The location of the exciton zone of formation (EZF) for the multi-emissive layer structure affects the color and efficiency of the device; therefore, it is important to the device design. The ratio of $k_{nr}$ to $k_r$ or its reciprocal for each of the individual emissive layers can be used to determine the placement of each of the emissive layers with respect to the EZF. In one preferred embodiment the emissive layers were ordered in such a manner that the ratio of $k_{nr}$ to $k_r$ was highest near the EZF and lowest far from the EZF. It is believed that this layer arrangement improved the device efficiency of the white light emitting, electrophosphorescent OLED.

Figure 10:
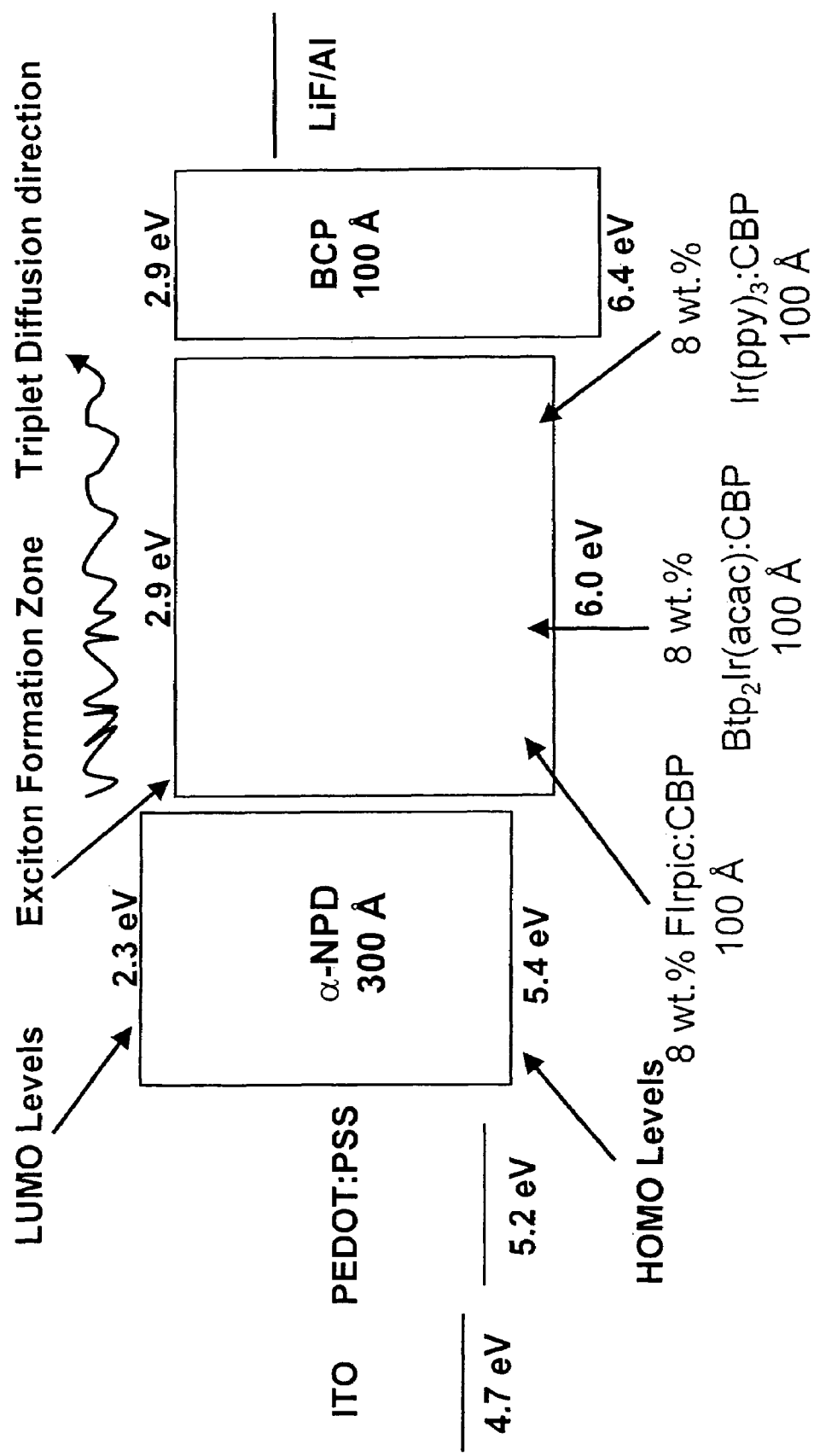
FIG. 10 shows an energy level diagram for one embodiment of the invention, comprising an all phosphor triple-emissive region, white OLED employing FIrpic, Ir(ppy)$_3$ and Btp$_2$Ir(acac) doped into CBP. The exciton formation zone is at the NPD/CBP interface, and excitons are shown to diffuse toward the exciton blocking BCP layer.
Figure 11:
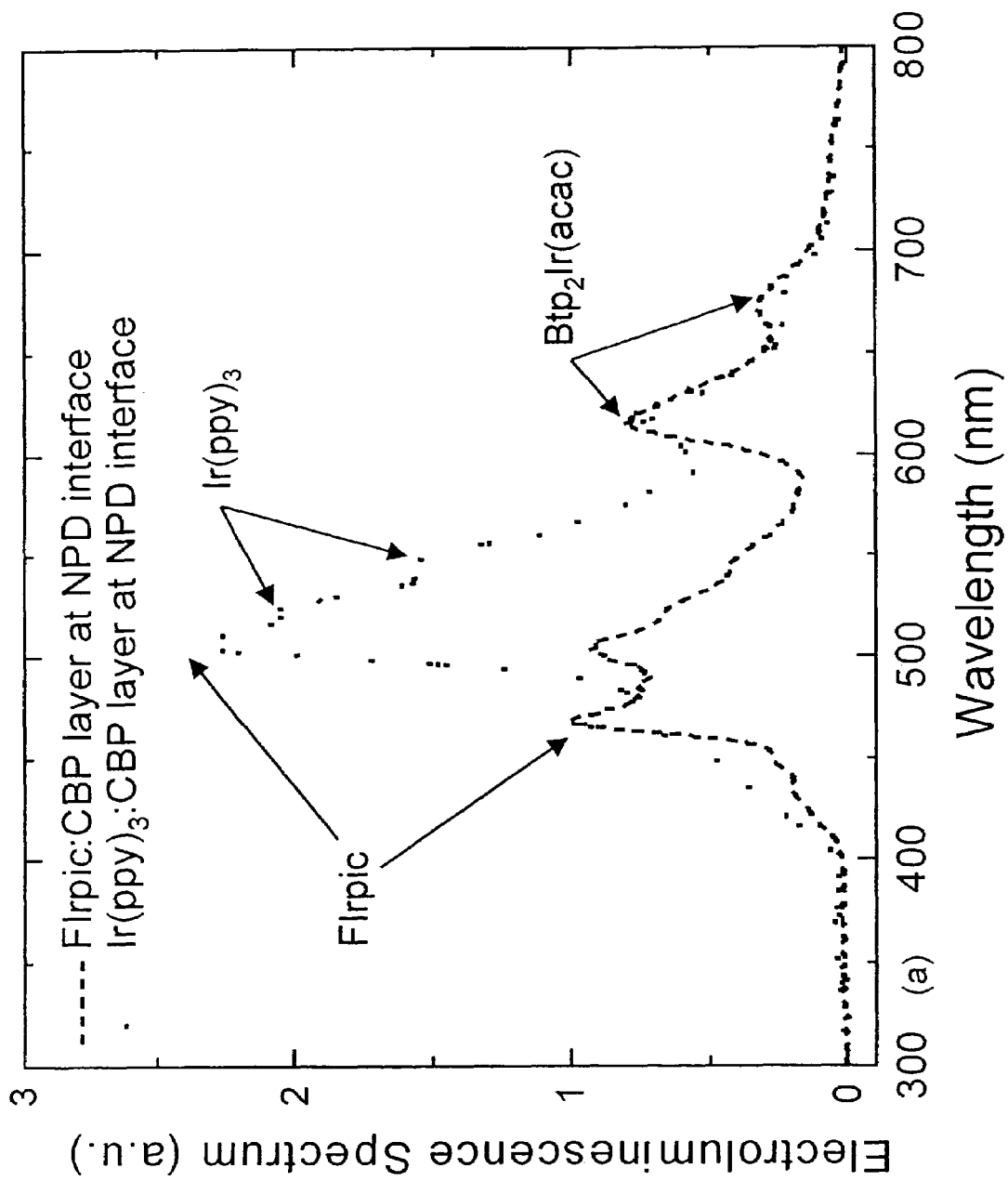
FIG. 11 shows the electroluminescence spectra for the embodiment of the invention shown in FIG. 9, and for another embodiment of the invention, having a similar device structure with the location of the FIrpic and Ir(ppy)$_3$ doped regions interchanged. The main Ir(ppy)$_3$ peak at 520-nm is significantly higher for the device with Ir(Ppy)$_3$ at the exciton formation zone, which is at the NPD/CBP interface. The peak at 500-nm is due to Ir(ppy)$_3$ and a sub-peak from FIrpic. Btp$_2$Ir(acac) peaks are at 620-nm and 675-nm.
Figure 12:
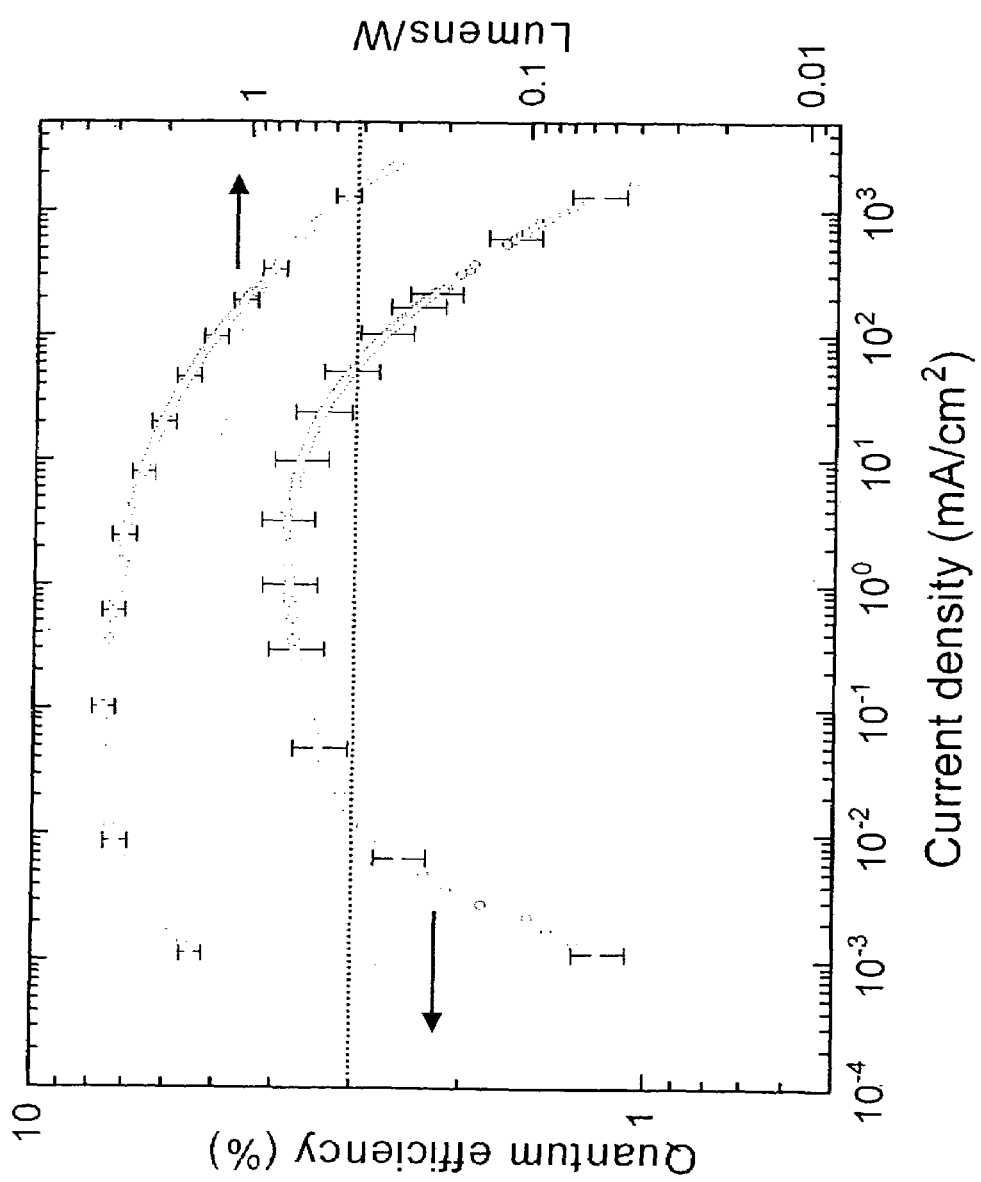
FIG. 12 shows the power and external quantum efficiency versus current density for one embodiment of the invention, having CIE coordinates (0.31, 0.35) and a device structure as shown in FIG. 9. The maximum external quantum efficiency, $\eta_p$ and luminance are (4.0±0.4) %, (3.3±0.3) lm/W, and (36000±4000) cd/m$^2$, respectively.

Due to the equivalence in the transport of holes and electrons by CBP, it is unclear from the energy level diagram shown in FIG. 10 as to where the exciton zone of formation is located. Holes could possibly accumulate at the CBP:BCP interface or electrons could accumulate at the NPD:CBP interface. To investigate the location of the EZF, two embodiments of the invention described as Device 2 were fabricated, having an 8 wt. % $Ir(ppy)_3$:CBP layer placed at one of the two interfaces. The inventors believe that $Ir(ppy)_3$ is the most efficient of the three phosphors used in the two embodiments; therefore, $Ir(ppy)_3$ should have a dominant main peak when placed at the EZF. FIG. 11 shows that an $Ir(ppy)_3$ peak at $\lambda$=520 nm is more intense compared to the main FIrpic peak at $\lambda$=470 nm when an $Ir(ppy)_3$:CBP layer was placed next to NPD. The peak at $\lambda$=500 nm is a combination of emission from $Ir(ppy)_3$ and a FIrpic sub-peak at $\lambda$=500 nm. When the $Ir(ppy)_3$:CBP layer was placed next to the BCP layer, the $Ir(ppy)3$ peak at $\lambda$=520 nm was lower relative to the main FIrpic peak at $\lambda$=470 nm; therefore, the inventors believe that the EZF was located at the NPD:CBP interface. Therefore, a preferred embodiment of the invention placed an FIrpic:CBP layer with a concentration of about 8 wt. % at this interface to improve the efficiency of the white light emitting OLED. Results for this preferred embodiment of the present invention, having a layer thickness of about 10 nm for each of the emissive layers and stacked in the order shown in FIG. 9, had a CIE coordinate of (0.31, 0.35). The external quantum efficiency of the device is shown as a function of its current density in FIG. 12. Assuming a lambertian intensity profile and calculating maximum external quantum efficiency, $\eta_p$ yields a value of $\eta_p$ equal to (4.0±0.4) % and a luminance of (3.3±0.3) lm/W or (36000±4000) cd/m$^2$ at 15.8 V. The external quantum efficiency was at least 3.0% over a corresponding current density of three orders of magnitude, as shown in FIG. 12. The inventors believe that the comparatively low external efficiency at low values of current density might be caused by current leakage; whereas, at high current densities J>10 mA/cm$^2$, the roll-off has been previously ascribed to triplet-triplet annihilation. [M. A. Baldo, C. Adachi and S. R. Forrest, Phys. Rev. B 62, 10967 (2000)] The value of $\eta_p$ would be even greater, except that the specific embodiment tested had reduced levels of emission between $\lambda$=550 nm and $\lambda$=600 nm, and lumens are based on the photopic response curve, which has a peak value at $\lambda$=555 nm.

It is believed that the break in vacuum, which was in this embodiment of the invention to add the cathode, also limited the device efficiency, because the vacuum break would tend to introduce non-radiative defect states during exposure to the nitrogen atmosphere. The inventors would expect even higher device efficiencies using ultrahigh vacuum conditions throughout the fabrication process. In a preferred embodiment of the process for fabrication, the cathode layer is deposited without any break in the ultrahigh vacuum environment.

Device 3 Poly(ethylene-dioxythiophene):poly(styrene sulphonic acid) (PEDOT:PSS was spun onto the ITO at 4000 rpm for 40 seconds and then baked for 15 mins at 120° C., attaining an approximate thickness of 40 nm. Deposition began with a 30 nmn-thick 4,4'-bis[N-(1-napthyl)-N-phenyl-amino]biphenyl ($\alpha$-NPD) hole transport layer (HTL). For Device 3, an emissive region (EMR) was grown consisting of a 20 nm-thick layer of the primarily electron conducting host 4,4'-N,N'-dicarbazole-biphenyl (CBP) doped with 6 wt % of the blue emitting phosphor, iridium (III)bis(4,6-di-fluorophenyl)-pyridinato-N,$C^2$) picolinate (FIrpic), followed by a 2 nm-thick CBP layer doped at 8 wt % with the red phosphor; bis(2-(2'-benzo[4,5-a]thienyl)pyridinato-N,$C^3$) iridium(acetylacetonate) ($Btp_2Ir$(acac)), and a 2 nm-thick CBP layer doped at 8 wt % with the yellow phosphor; bis(2-phenyl benzothiozolato-N,$C^2$) iridium(acetylacetonate) ($Bt_2Ir$(acac)). BCP was the final organic layer deposited on all devices and served as both a hole/exciton blocker and an electron transport layer (ETL). After deposition of the organic layers, the samples were transferred from the evaporation chamber into a $N_2$ filled glove box containing $\leq 1$ ppm of $H_2O$ and $O_2$. After affixing masks with 1 mm diameter openings to the samples, they were transferred into a second vacuum chamber ($<10^{-7}$ Torr) where a cathode was deposited through the masks. The cathode consisted of 5 Å of LiF followed by 100 nm of Al.

Device 4 Poly(ethylene-dioxythiophene):poly(styrene sulphonic acid) (PEDOT:PSS was spun onto the ITO at 4000 rpm for 40 seconds and then baked for 15 mins at 120° C., attaining an approximate thickness of 40 nm. Deposition began with a 30 nm-thick 4,4'-bis[N-(1-napthyl)-N-phenyl-amino]biphenyl ($\alpha$-NPD) hole transport layer (HTL). For Device 4, the EMR consisted of a 20 nm-thick layer of CBP doped with 6 wt % of FIrpic, followed by a 3 nm-thick 2,9-dimethyl-4,7-diphenyl-1,10-phenanthroline (BCP) exciton blocking layer, and a 10 nm-thick CBP layer doped with 8 wt % $Btp_2Ir$(acac). BCP was the final organic layer deposited on all devices and served as both a hole/exciton blocker and an electron transport layer (ETL). After deposition of the organic layers, the samples were transferred from the evaporation chamber into a $N_2$ filled glove box containing $\leq 1$ ppm of $H_2O$ and $O_2$. After affixing masks with 1 mm diameter openings to the samples, they were transferred into a second vacuum chamber ($<10^{-7}$ Torr) where a cathode was deposited through the masks. The cathode consisted of 5 Å of LiF followed by 100 nm of Al.

The control of the diffusion of triplet excitons provides a means for obtaining the desired color balance. Triplets have lifetimes that are several orders of magnitude longer than singlets, hence they have longer diffusion lengths, allowing emissive layers to be >10 nm thick. Hence, to achieve a desired emission color, the thickness of each layer doped with a different phosphor can be adjusted to serve as a recombination zone of the appropriate fraction of excitons initially formed at the HTL/EMR interface.

Figure 13:
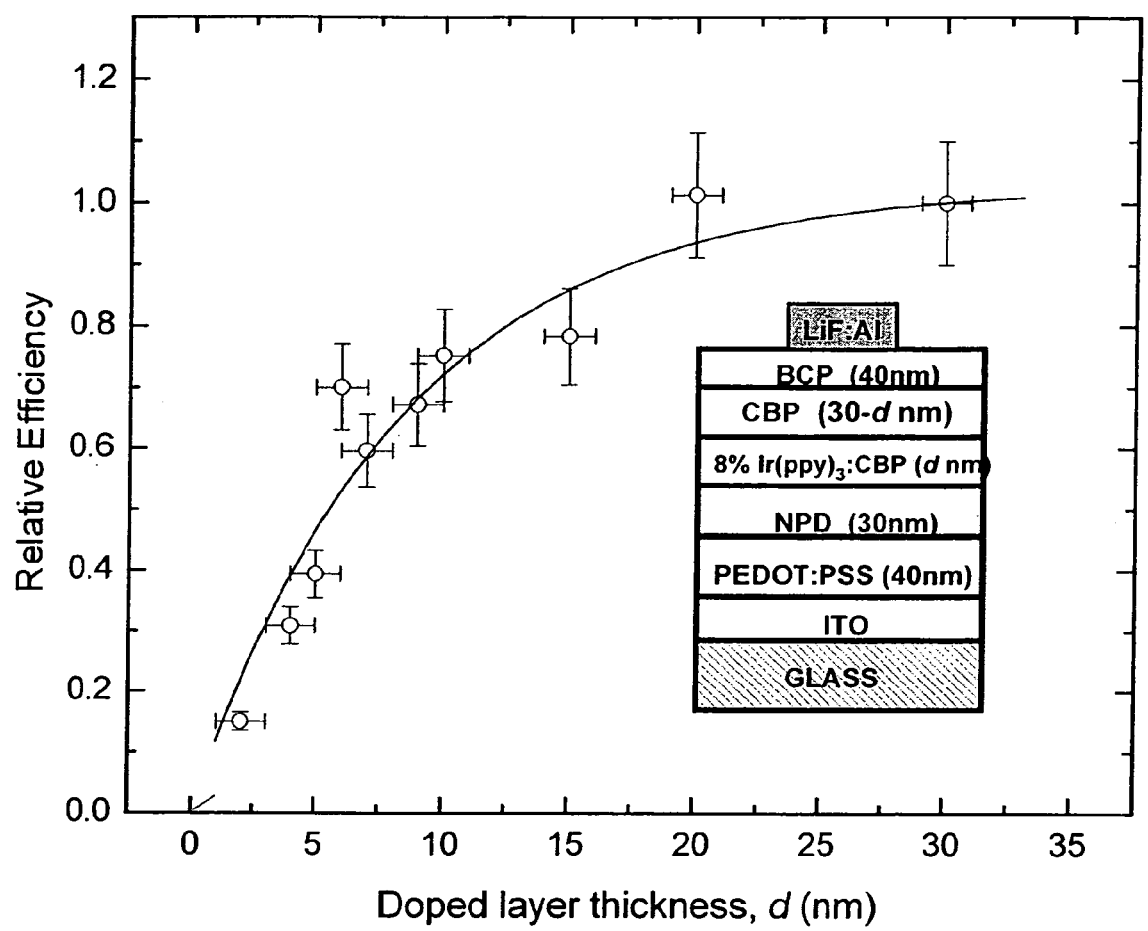
FIG. 13 shows the relative efficiencies of devices with 300-d Å of CBP doped with Ir(ppy)$_3$ compared to a device with 300 Å of CBP doped with Ir(ppy)$_3$. The solid line is a chi-square fit of the points to Equation (2). A CBP triplet diffusion length of (83±10)Å was obtained from the fit. Inset: Device structure used to probe the triplet exciton concentration in CBP.

To design such a structure, the CBP triplet exciton diffusion length, $L_D$, is first determined. This is done by varying the thickness (d) of a fac tris(2-phenylpyridine)iridium (Ir(ppy)$_3$) phosphor doped region within a 30 nm thick CBP layer in the structure shown in FIG. 13. The efficiencies of the various devices are then compared to the efficiency of a device with the entire CBP region doped with Ir(ppy)$_3$. That is, assuming a linear relationship between the exciton density between position x and x+$\Delta$x, and the amount of light emitted from that region, the CBP exciton density is then related to the green Ir(ppy)$_3$ emission via:

$$\eta(x) = \frac{\eta(30)(1 - e^{-d/L_D})}{(1 - e^{-d_0/L_D})}, \quad (1)$$

where $\eta(d)$ is the efficiency of a device with a doped CBP layer of thickness d, and $\eta(30)$ is the efficiency of the device with $d_0=30$ nm of CBP doped with Ir(ppy)$_3$. We obtain a CBP triplet diffusion length of $(8.3\pm 1)$ nm using a chi-square fit (solid line) of the data in FIG. 13 to Eq. (1).

Figure 14:
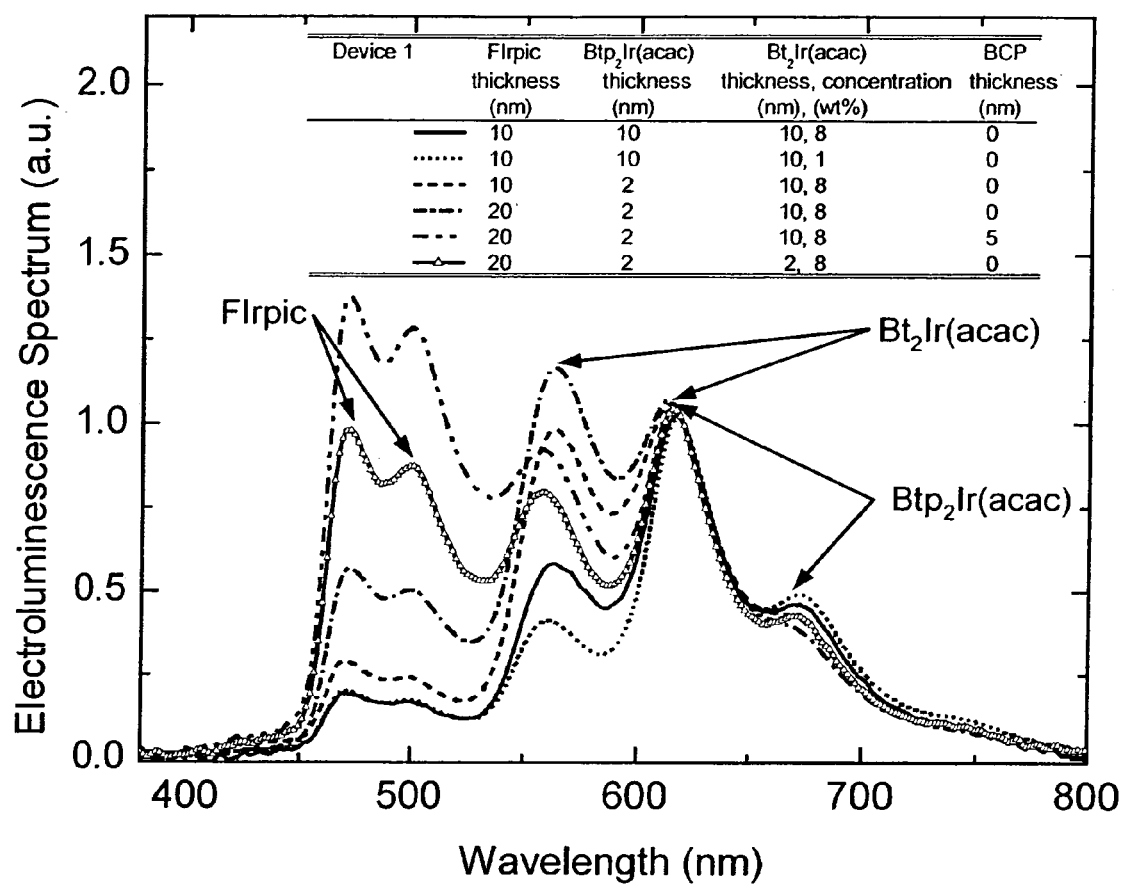
FIG. 14 shows the variation, at 10 mA/cm$^2$, in the electroluminescence spectra with layer thickness, dopant concentration, and the insertion of an exciton/hole blocking layer between the FIrpic and Btp$_2$Ir(acac) doped layers for the Device 3.

By varying the concentration of the dopants, the location of the different color regions with respect to the HTL interface where exciton formation occurs, the thicknesses of each of the layers, and by inserting an exciton blocking layer between emissive layers, the CIE coordinates of the OLED emission can be tuned over a wide range. However, we note that the phosphors with lower triplet energy and which therefore trap excitons most readily should be positioned farthest from the exciton formation region. This ensures that the excitons can diffuse throughout the luminescent region, producing the desired output color balance. FIG. 14 shows the dependence of electrophosphorescent spectrum of Device 3 on layer thickness, phosphor doping concentration, and the insertion of a blocking layer between the FIrpic and $Btp_2Ir$(acac) doped regions. All spectra were recorded at 10 mA/cm$^2$, corresponding to luminances ranging between 400- and 800 cd/m$^2$.

FIrpic emission peaks at $\lambda=472$ nm and at $\lambda=500$ nm, shown in FIG. 14, increase relative to the $Btp_2Ir$(acac) emission at $\lambda=620$ nm when the thickness of the $Bt_2Ir$(acac) and $Btp_2Ir$(acac) doped layers are reduced to 2 nm, and when the thickness of the FIrpic layer is increased to 20 nm, because a larger fraction of the total number of excitons diffuse into the FIrpic layer and hence are available for emission from this somewhat less efficient dopant. However, FIrpic emission does not increase relative to $Btp_2Ir$(acac) emission for FIrpic doped layer thicknesses exceeding 30 nm. This suggests that the exciton formation zone (EFZ) is not at the HTL/EMR interface as seen in the diffusion profile of CBP triplets measured using Ir(pPy)$_3$, since FIrpic emission should continue to increase relative to all other phosphor emission with increasing FIrpic layer thickness. The precise location of the EFZ in the WOLED is difficult to establish since it may shift depending on the several variables considered for color balancing.

The color balance (particularly enhancement of blue emission) can be improved by inserting a thin BCP, hole/exciton blocking layer between the FIrpic and $Btp_2Ir$(acac) doped layers in Device 4. This layer retards the flow of holes from the FIrpic doped layer towards the cathode and thereby forces more excitons to form in the FIrpic layer, and it prevents excitons from diffusing towards the cathode after forming in the FIrpic doped layer. These two effects increase FIrpic emission relative to $Btp_2Ir$(acac).

The main $Bt_2Ir$(acac) emission peak at $\lambda=563$ nm is easily discernable from its sub-peak at $\lambda=600$ nm which overlaps the main Btp$_2$Ir(acac) peak (FIG. 14). The peak at λ=563 nm decreases when the doping concentration of Bt$_2$Ir(acac) is reduced from 8 wt % to 1 wt % and when the layer thickness is reduced from 10 nm to 2 nm. At 1 wt % Bt$_2$Ir(acac), the transfer of triplets between the host and guest molecules is hindered because fewer guest molecules are within the Forster transfer radius (~30 Å) of the host, decreasing proportionately the fraction of Bt$_2$Ir(acac) emission. For the exciton concentration profile described by Eq. (1), η(2)<η (10) because the dopant can capture more of the CBP triplets for thicker doped regions. Hence, the emission from a 2 nm thick Bt$_2$Ir(acac) doped layer should be lower than for a 10 nm thick layer because it captures fewer CBP excitons.

Figure 15:
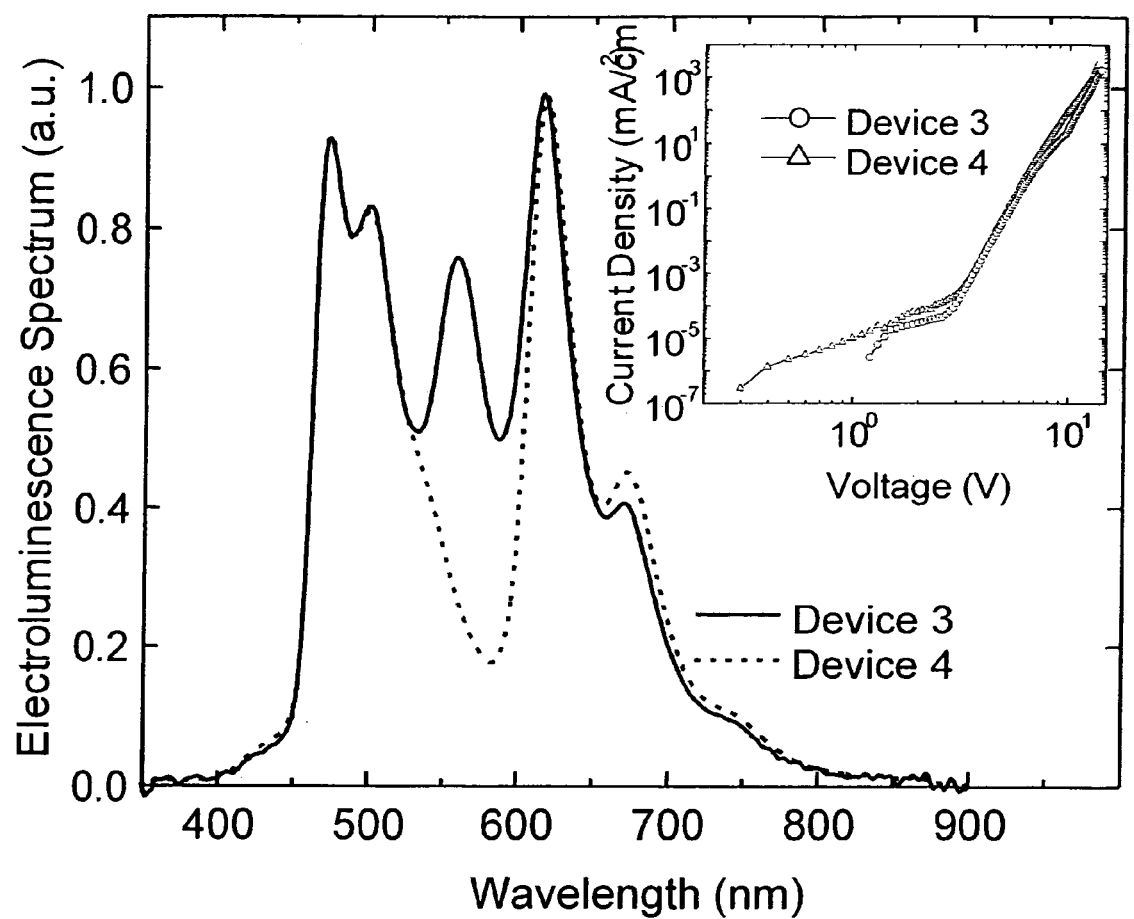
FIG. 15 shows the electroluminescent spectra of Devices 3 and 4 at 10 mA/cm$^2$. Inset: Current density versus voltage characteristics of Device 3 and 4.

Device 3 and 4 electroluminescent spectra are compared in FIG. 15. For Device 4, there is almost no emission between λ=520 nm and λ=600 nm, whereas Device 3 has significantly more emission from Bt$_2$Ir(acac) in this region. The enhancement of the yellow region of the spectrum for Device 3 increases the CRI from 50 to 83 and shifts the CIE from (0.35, 0.36) to (0.37, 0.40) relative to Device 4. The x and y CIE coordinates of all the devices varied by <10% between 1 mA/cm$^2$ and 500 mA/cm$^2$, corresponding to luminances in the range from 60- to 20000 cd/m$^2$.

Device 4 is useful for flat-panel displays since the human perception of white from the display will be unaffected by the lack of emission in the yellow region of the spectrum. In theory, the best white that can be made with FIrpic and Btp$_2$Ir(acac) doped into CBP is at (0.33, 0.32), close to that of Device 4 of (0.35, 0.36). With a CRI of 83, Device 3 can be used in flat-panel displays, but it can also be used as an illumination source, since at this high a CRI value, objects will appear as they would under daylight conditions. The CRI of Device 4 can be theoretically improved to a maximum value of 88, however, the CIE of such an optimized device is (0.47, 0.40). The additional doped layer also improves the efficiency of Device 4 as compared to Device 3 by boosting the yellow emission where the human eye has the highest photopic efficiency, and by the use of Bt$_2$Ir(acac) which has a higher $\eta_{ext}$ than FIrpic.

Figure 16:
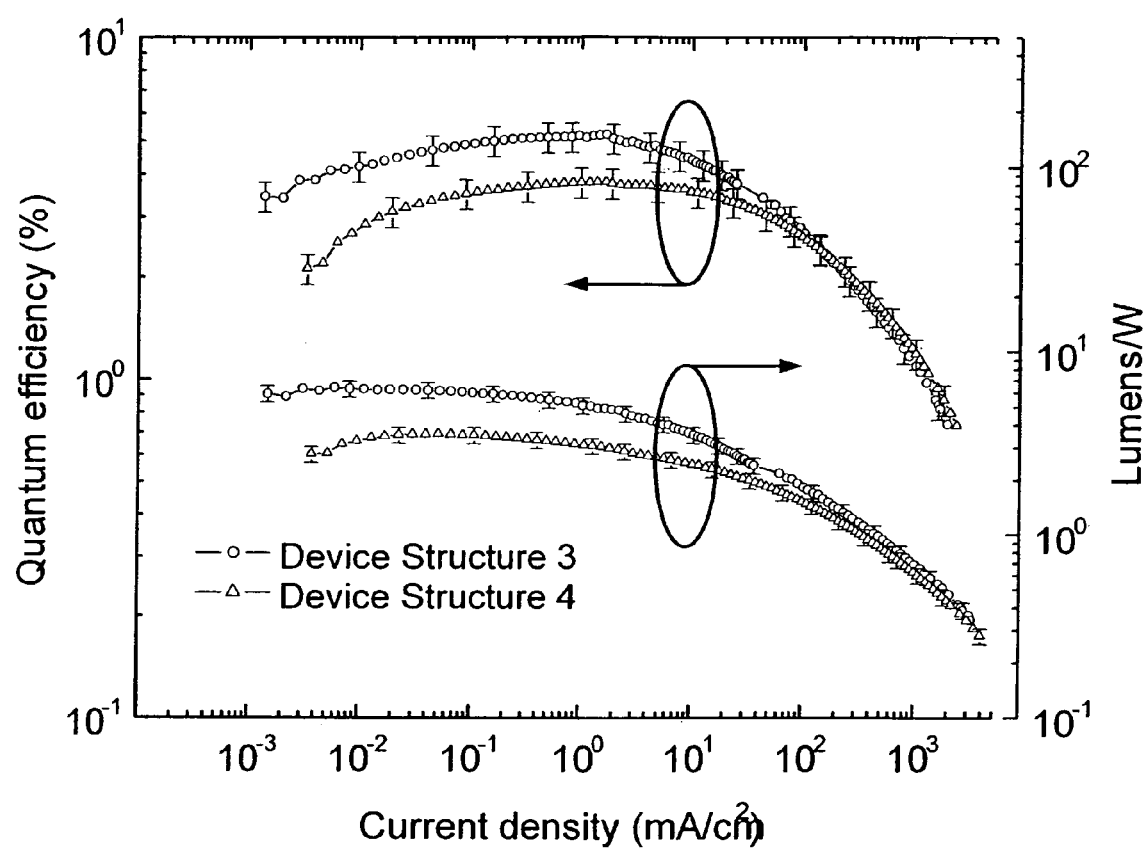
FIG. 16 shows the power and external quantum efficiency versus current density for Devices 3 and 4.
Figure 17:
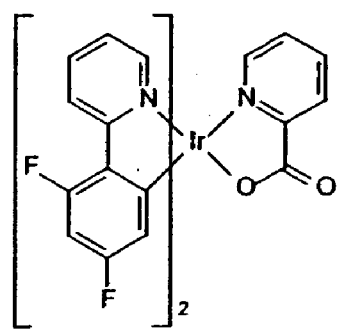
FIG. 17 shows the chemical structures of Ir(ppy)$_3$, FIrpic, Bt$_2$Ir(acac), Btp$_2$Ir(acac)
Figure 17:
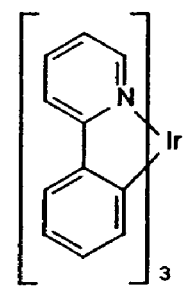
Figure 17:
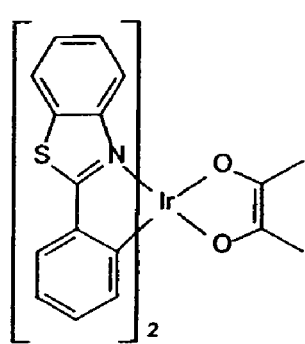
Figure 17:
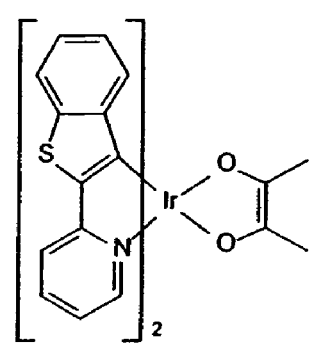

We assume lambertian intensity profiles and calculate the $\eta_{ext}$, $\eta_p$ (shown in FIG. 16) and luminance using the current density-voltage characteristics shown in the inset of FIG. 15. Table 2 shows the results for both Devices 3 and 4. Here, $\eta^{ext}$ 3.0% over three orders of magnitude in current density, and $\eta_{ext}$ is found to increase to a maximum value and then roll-off at higher-current densities. The initial low $\eta_{ext}$ is possibly due to current leakage; whereas at high current densities (J>10 mA/cm$^2$), the roll-off has been previously ascribed to triplet-triplet annihilation. Device 3 attains a maximum luminance of 31000 cd/m$^2$ at 14 V, and Device 4 emits 30000 cd/m$^2$ at 13.4 V.

The break in vacuum necessary to define the cathode region limits the efficiency of the all-phosphor WOLED because of the introduction of non-radiative defect states due to exposure to atmosphere. Exciton transfer between CBP and FIrpic is especially sensitive to defects due to the endothermic process characteristic of this material system. Higher efficiency WOLEDs, therefore, can be expected if the entire device is grown under high vacuum conditions.

Those with skill in the art may recognize various modifications to the embodiments of the invention described and illustrated herein, and the present invention includes these modifications and is not intended to be limited to the examples contained herein.

What is claimed is:

1. An organic light emitting device, comprising:
an anode, a cathode, and an emissive region; wherein
the emissive region is located between the anode and the cathode, and comprises a host material, a plurality of emissive dopants, and a plurality of bands; wherein
each emissive dopant is doped into a separate band within the emissive region; and
the host material in at least a portion of the bands is different from one band to the next; wherein
at least one of the emissive dopants emits light by phosphorescence from a triplet molecular excited state; and wherein
a combined emission of the plurality of emissive dopants sufficiently spans the visible spectrum to give a white emission.

2. The device of claim 1, wherein the combined emission has a color rendering index of at least about 70.

3. The device of claim 2, wherein the combined emission has a color rendering index of at least about 80.

4. The device of claim 1, wherein more than one emissive dopant emits by phosphorescence.

5. The device of claim 1, wherein each emissive dopant emits by phosphorescence.

6. The device of claim 1, wherein at least one of the emissive dopants is an organometallic compound.

7. An organic light emitting device, comprising:
an anode, a cathode, and an emissive region; wherein
the emissive region is located between the anode and the cathode, and comprises a host material, a plurality of emissive dopants, a host layer doped with at least one phosphorescent dopant, and a separate host layer doped with a fluorescent dopant; wherein
the at least one phosphorescent dopant emits light by phosphorescence from a triplet molecular excited state; and
a combined emission of the plurality of emissive dopants sufficiently spans the visible spectrum to give a white emission.

8. The device of claim 7, wherein the combined emission has a color rendering index of at least about 70.

9. The device of claim 8, wherein the combined emission has a color rendering index of at least about 80.

10. The device of claim 7, wherein more than one emissive dopant emits by phosphorescence.

11. The device of claim 7, wherein at least one phosphorescent dopant is an organometallic compound.

12. The device of claim 7, wherein each phosphorescent dopant is an organometallic compound.

13. An organic light emitting device, comprising:
an anode, a cathode, and an emissive region; wherein
the emissive region is located between the anode and the cathode, and comprises:
a host material and a plurality of emissive dopants; wherein
the plurality of emissive dopants comprise a first phosphorescent dopant and a second phosphorescent dopant;
the first and second phosphorescent dopants emit light by phosphorescence from a triplet molecular excited state; and
a combined emission of the plurality of emissive dopants sufficiently spans the visible spectrum to give a white emission.

14. The device of claim 13, wherein the second doped region is contained in its entirety within the first doped region.

15. The device of claim 13, wherein the combined emission has a color rendering index of at least about 70.

16. The device of claim 15, wherein the combined emission has a color rendering index of at least about 80.

17. The device of claim 13, wherein at least one phosphorescent dopant is an organometallic compound.

18. The device of claim 13, wherein each phosphorescent dopant is an organometallic compound.

19. The device of claim 13, wherein a first doped region of the first phosphorescent dopant overlaps a second doped region of the second phosphorescent dopant.

* * * * *